US012148807B2

(12) United States Patent
Chu et al.

(10) Patent No.: US 12,148,807 B2
(45) Date of Patent: Nov. 19, 2024

(54) BACKSIDE CONTACT STRUCTURES WITH STACKED METAL SILICIDE LAYERS FOR SOURCE/DRAIN REGION OF FIN FIELD TRANSISTORS

(71) Applicant: Taiwan Semiconductor Manufacturing Co., Ltd., Hsinchu (TW)

(72) Inventors: Chia-Hung Chu, Taipei (TW); Ding-Kang Shih, New Taipei (TW); Keng-Chu Lin, Chao-Chou (TW); Pang-Yen Tsai, Jhu-bei (TW); Sung-Li Wang, Zhubei (TW); Shuen-Shin Liang, Hsinchu County (TW); Tsungyu Hung, Hsinchu (TW); Hsu-Kai Chang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 214 days.

(21) Appl. No.: 17/371,245

(22) Filed: Jul. 9, 2021

(65) Prior Publication Data

US 2023/0012147 A1 Jan. 12, 2023

(51) Int. Cl.
*H01L 29/417* (2006.01)
*H01L 21/285* (2006.01)
*H01L 29/40* (2006.01)
*H01L 29/423* (2006.01)

(52) U.S. Cl.
CPC .. *H01L 29/41775* (2013.01); *H01L 21/28518* (2013.01); *H01L 29/401* (2013.01); *H01L 29/42392* (2013.01)

(58) Field of Classification Search
CPC ......... H01L 29/41775; H01L 21/28518; H01L 29/42392; H01L 29/401; H01L 29/45; H01L 29/0673; H01L 21/823814; H01L 21/823871; H01L 21/76897; H01L 29/41766
See application file for complete search history.

(56) References Cited

U.S. PATENT DOCUMENTS

| 9,105,490 | B2 | 8/2015 | Wang et al. |
| 9,236,267 | B2 | 1/2016 | De et al. |
| 9,236,300 | B2 | 1/2016 | Liaw |
| 9,406,804 | B2 | 8/2016 | Huang et al. |
| 9,443,769 | B2 | 9/2016 | Wang et al. |
| 9,520,482 | B1 | 12/2016 | Chang et al. |
| 9,548,366 | B1 | 1/2017 | Ho et al. |

(Continued)

*Primary Examiner* — Changhyun Yi
(74) *Attorney, Agent, or Firm* — Sterne, Kessler, Goldstein & Fox P.L.L.C.

(57) ABSTRACT

The present disclosure describes a method to form a semiconductor device with backside contact structures. The method includes forming a semiconductor device on a first side of a substrate. The semiconductor device includes a source/drain (S/D) region. The method further includes etching a portion of the S/D region on a second side of the substrate to form an opening and forming an epitaxial contact structure on the S/D region in the opening. The second side is opposite to the first side. The epitaxial contact structure includes a first portion in contact with the S/D region in the opening and a second portion on the first portion. A width of the second portion is larger than the first portion.

20 Claims, 15 Drawing Sheets

(56) References Cited

U.S. PATENT DOCUMENTS

| | | | |
|---|---|---|---|
| 9,576,814 B2 | 2/2017 | Wu et al. | |
| 9,831,183 B2 | 11/2017 | Lin et al. | |
| 9,859,386 B2 | 1/2018 | Ho et al. | |
| 11,626,494 B2 | 4/2023 | Chu et al. | |
| 2019/0157406 A1* | 5/2019 | Hwang | H01L 29/0653 |
| 2021/0408246 A1* | 12/2021 | Ganguly | H01L 21/02532 |
| 2022/0406715 A1* | 12/2022 | Xie | H01L 29/775 |

* cited by examiner

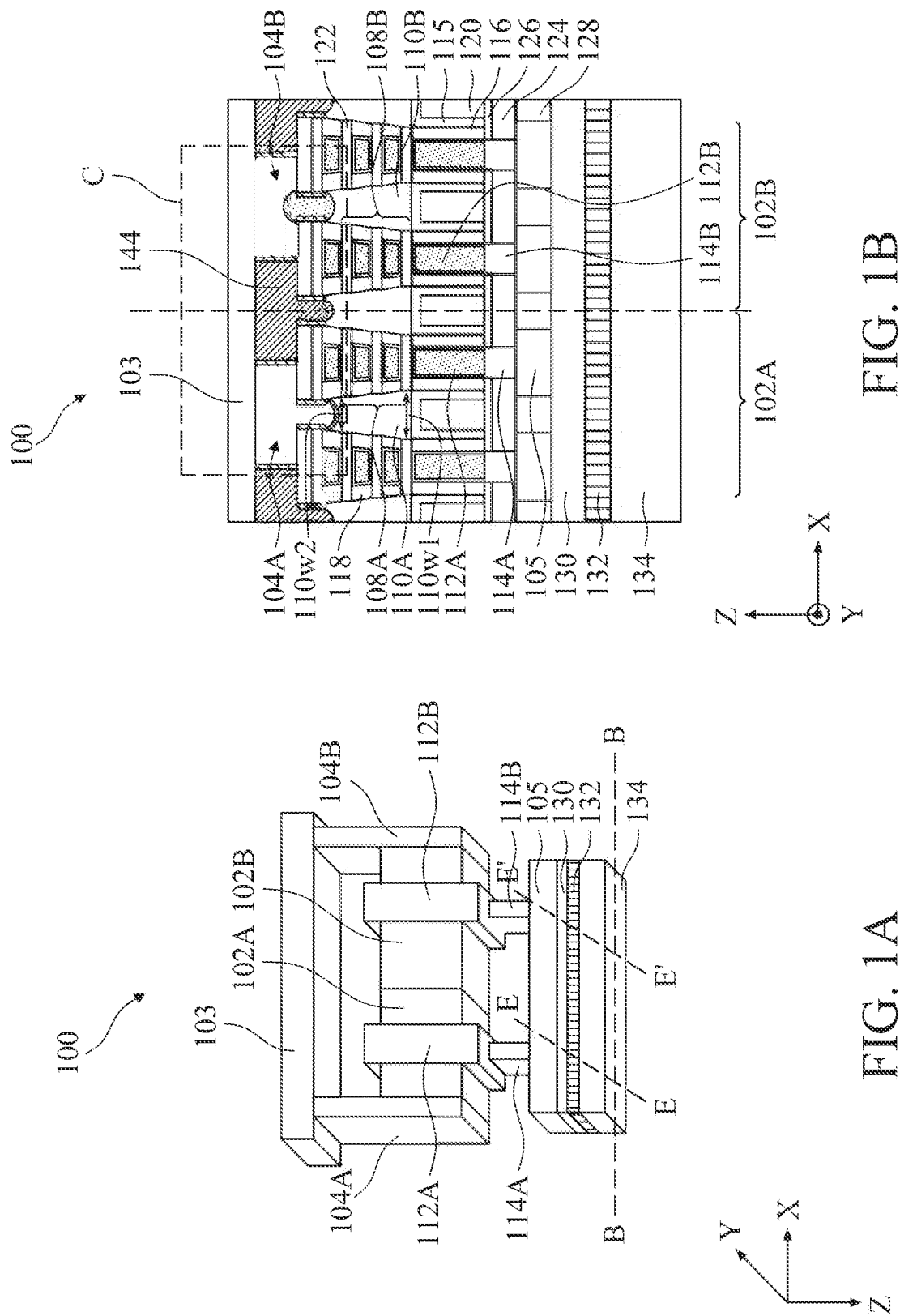

BACKSIDE CONTACT STRUCTURES WITH STACKED METAL SILICIDE LAYERS FOR SOURCE/DRAIN REGION OF FIN FIELD TRANSISTORS

BACKGROUND

With advances in semiconductor technology, there has been increasing demand for higher storage capacity, faster processing systems, higher performance, and lower costs, To meet these demands, the semiconductor industry continues to scale down the dimensions of semiconductor devices, such as metal oxide semiconductor field effect transistors (MOSFETs), including planar MOSFETs and fin field effect transistors (finFETs). Such scaling down has increased the complexity of semiconductor manufacturing processes.

BRIEF DESCRIPTION OF THE DRAWINGS

Aspects of the present disclosure are best understood from the following detailed description when read with the accompanying figures.

FIGS. 1A, 1B, 1C, 1D, and 1E illustrate an isometric view and various cross-sectional views of a semiconductor device with backside contact structures having an epitaxial contact structure, respectively, in accordance with some embodiments.

Illustrative embodiments will now be described with reference to the accompanying drawings. In the drawings, like reference numerals generally indicate identical, functionally similar, and/or structurally similar elements.

DETAILED DESCRIPTION

Figures 1C, 1D:
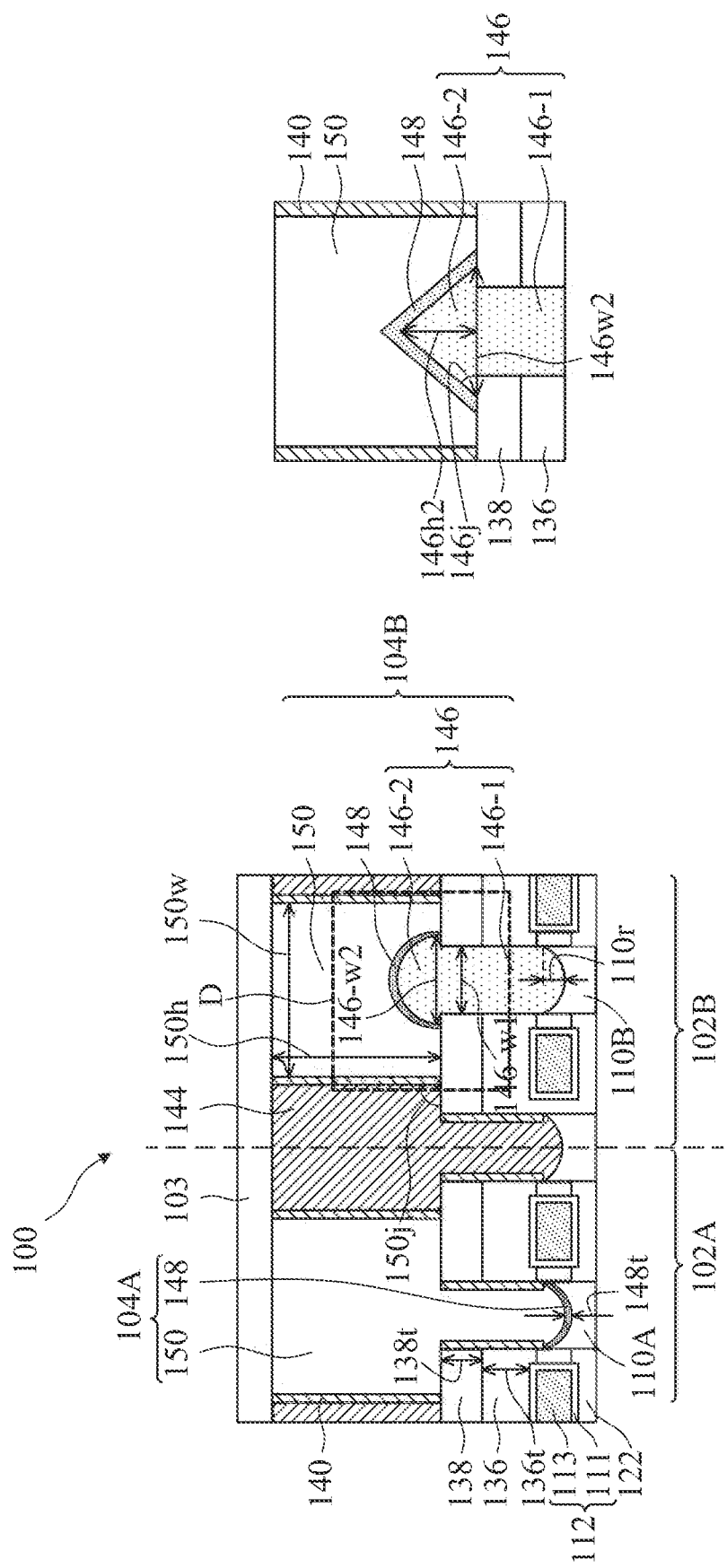

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled m relevant art(s) in light of the teachings herein.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

With increasing demand for lower power consumption, higher performance, and smaller area (collectively referred to as "PPA") of semiconductor devices, backside power rails (BPR) can be implemented in semiconductor devices to reduce the device area and the metal interconnect length, thus reducing parasitic capacitances and parasitic resistances and improving device performance. For example, backside power rails can improve performance of power delivery network (PDN) for advanced technology nodes. To implement backside power rails, reducing contact resistances is an Objective of the process development. With the continuous scaling down of the dimensions, reducing contact resistance of the semiconductor devices can be challenging.

Contact resistance of a field effect transistor (FET) can depend on a Schottky barrier height (SBH) between metal silicide layers of source/drain (S/D) contact structures and S/D regions of the FET. SBH is a potential energy barrier for electrons formed at a metal-semiconductor junction. High SBH can result in high contact resistance. SBH can depend on the metal used to form the metal silicide layers. Different metal silicide layers on the same S/D regions of the FET can have different SBHs. For metal silicide layers formed with the same metal, n-type FET (NFET) and p-type FET (PFET) can have different SBHs due to different dopings of the S/D regions of the NFET and PEET. The term "p-type" can be associated with a structure, layer, and/or region doped with p-type dopants, such as boron. The term "n-type" can be associated with a structure, layer, and/or region doped with n-type dopants, such as phosphorus. A single metal silicide layer may not provide low contact resistances for both NFETs and PFETs in the semiconductor device.

In addition, the contact resistance of the FETs in the semiconductor device can depend on the contact areas between the metal suicide layers and the S/D regions of the FETs. Furthermore, the processing temperatures of backside processes may be limited, as the metals at the front side of the semiconductor devices may diffuse at higher temperatures (e.g., above about 450° C.) and degrade device performance.

Various embodiments in the present disclosure provide methods for forming a semiconductor device with backside contact structures. According to some embodiments, the backside contact structures can include an epitaxial contact structure. The epitaxial contact structure can have a first portion in contact with a source/drain (S/D) region of the semiconductor device and a second portion on the first portion. A width of the second portion can be larger than a width of the first portion. The contact area between the epitaxial contact structure and the metal contacts can be increased and the contact resistance of the backside contact structures can be reduced by about 30% to about 70%. In some embodiments, the epitaxial contact structure can include an active dopant higher than about $1 \times 10^{21}$ cm$^{-3}$ to further reduce the contact resistance of the backside contact structures.

In some embodiments, the backside contact structures can include different metal silicide layers in contact with the S/D regions of different types of FETs in the semiconductor device. For example, the backside contact structures of one type of FET (e.g., PITT) can have a first metal silicide layer on the S/D regions and a second metal silicide layer on the first metal silicide layer. The backside contact structures of an opposite type of FET (e.g., NFET) can include the second metal silicide layer on the S/D regions. The first metal silicide layer can include a metal different from the second metal silicide layer, which can reduce the SBH between the first metal silicide layer and the S/D region of the semiconductor device and thus reduce the contact resistance of the backside contact structures by about 30% to about 70%. With the first metal suicide layer in one type of FET (e.g., PFET) and the second metal silicide layer in an opposite type of FET (e.g., NFET), the contact resistance of the one type of ITT in the semiconductor device can be reduced without increasing the contact resistance of the opposite type of FET.

Figure 1E:
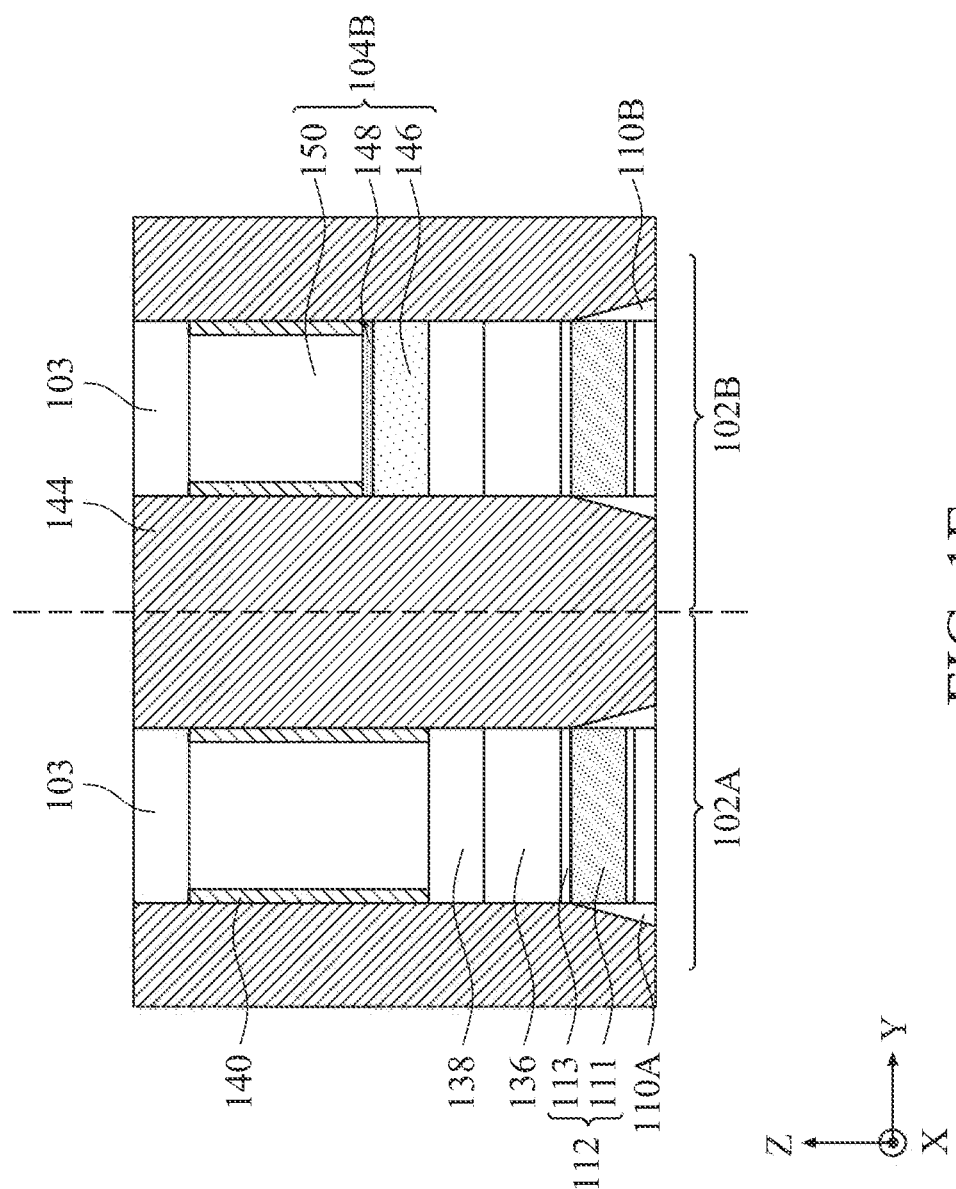

FIG. 1A illustrates an isometric view of a semiconductor device 100 with backside contact structures having an epitaxial contact structure, in accordance with some embodiments. Semiconductor device 100 can include a FET 102A connected to a FET 102B at an S/D region. S/D contact structure 104A of FET 102A and S/D contact structure 104B of FET 102B can connect to backside power rails 103 (also referred to as "backside contact structures 104A and 104B"). FIG. 1B illustrates a cross-sectional view of semiconductor device 100 along line B-B in FIG. 1A, in accordance with some embodiments. FIG. 1C illustrates region C FIG. 1B, according to some embodiments. FIG. 1D illustrate region D in FIG. 1C, according to another embodiment, FIG. 1E illustrate partial cross-sectional views of semiconductor device 100 along line E-E for FET 102A and line E'-E' for 102B in FIG. 1A, according to some embodiments. In some embodiments, FIGS. 1A-1E show a portion of an IC layout where the dimensions of the fin structures and the dimensions of the gate structures can be similar or different from the ones shown in FIGS. 1A-1E.

Referring to FIGS. 1A-1E, semiconductor device 100 can include FETs 102A and 102B, S/D contact structures 104A and 104B connected to backside power rails 103, and gate structures 112A and 112B (collectively referred to as "gate structures 112") connected to respective gate contact structures 114A and 114B (collectively referred to as "gate contact structures 114"), which are further connected to front-side power rails 105. FETs 102A and 102B can further include stacked fin structures 108A and 108B, S/D regions 110A and 110B, gate spacers 116, and inner spacer structures 118.

In some embodiments, FETs 102A and 102B can be both p-type finFETs (PFETs), both n-type finFETs (NFETs), or one of each conductivity type of finFET. In some embodiments, FET 102A can be n-type (also referred to as "NFET 102A"), FET 102B can be p-type (also referred to as "PFET 102B") and semiconductor device 100 can be an inverter logic device. Though FIGS. 1A and 1B show two finFETs, semiconductor device 100 can have any number of finFETs. In addition, semiconductor device 100 can be incorporated into an integrated circuit through the use of other structural components, such as conductive vias, conductive lines, dielectric layers, and passivation layers, that are not shown for simplicity. The discussion of elements of FETs 102A and 102B with the same annotations applies to each other, unless mentioned otherwise.

Figure 6:
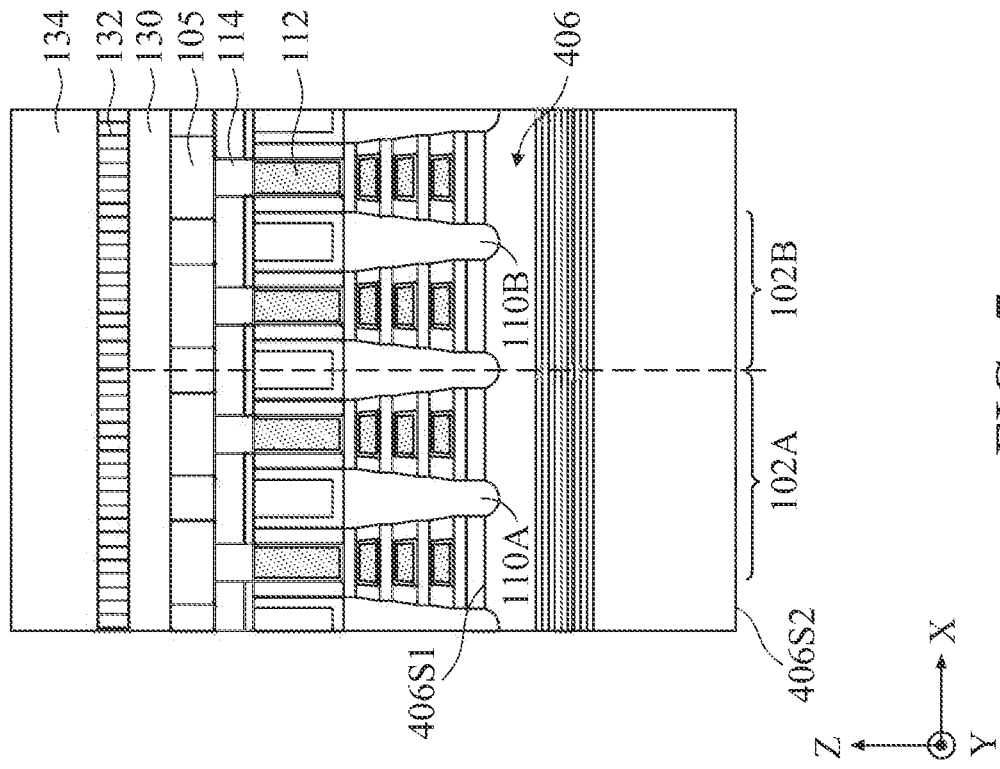

FETs 102A and 102B can be formed on a substrate 406, as shown in FIG. 6. In some embodiments, substrate 406 can include a semiconductor material, such as silicon (Si). In some embodiments, substrate 406 can include a silicon-on-insulator (SOI) substrate (e.g., SOI wafer). In some embodiments, substrate 406 can include (i) an elementary semiconductor, such as germanium (Ge); (ii) a compound semiconductor including silicon carbide (SiC), silicon arsenide (SiAs), gallium arsenide (GaAs), gallium phosphide (GaP), indium phosphide (InP), indium arsenide (InAs), indium antimonide. (InSb), and/or a III-V semiconductor material; (iii) an alloy semiconductor including silicon germanium (SiGe), silicon germanium carbide (SiGeC), germanium stannum (GeSn), silicon germanium stannum (SiGeSn), gallium arsenic phosphide (GaAsP), gallium indium phosphide (GaInP), gallium indium arsenide (GaInAs), gallium indium arsenic phosphide (GaInAsP), aluminum indium arsenide (AlInAs), and/or aluminum gallium arsenide (AlGaAs); (iv) a silicon germanium (SiGe)-on insulator structure (SiGeOI); (v) germanium-on-insulator (GeOI) structure; or (vi) a combination thereof. Further, substrate 406 can be doped depending on design requirements (e.g., p-type substrate or n-type substrate). In some embodiments, substrate 406 can be doped with p-type dopants (e.g., boron, indium, aluminum, or gallium) or n-type dopants (e.g., phosphorus or arsenic).

As shown in FIG. 1B, semiconductor device 100 can include stacked fin structures 108A and 108B extending along an X-axis and through FET 102A and FET 102B, respectively. Each of stacked fin structures 108A and 108B can include a stack of semiconductor layers 122, Which can be nanosheets or nanowires. Each of semiconductor layers 122 can form a channel region underlying gate structures 112A and 112B of FETs 102A and 102B, respectively. Embodiments of the fin structures disclosed herein may be patterned by any suitable method. For example, the fin structures may be patterned using one or more photolithography processes, including double-patterning or multi-patterning processes. Double-patterning or multi-patterning processes can combine photolithography and self-aligned processes, forming patterns that have, for example, pitches smaller than what is otherwise obtainable using a single, direct photolithography process. For example, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

In some embodiments, semiconductor layers 122 can include semiconductor materials similar to or different from substrate 406. In some embodiments, each of semiconductor layers 122 can include silicon germanium (SiGe) with Ge in a range from about 5 atomic percent to about 50 atomic percent with any remaining atomic percent being Si or can include Si without any substantial amount of Ge. The semiconductor materials of semiconductor layers 122 can be undoped or can be in-situ doped during its epitaxial growth process using: (i) p-type dopants, such as boron, indium, and gallium; and/or (ii) n-type dopants, such as phosphorus and arsenic. Though three layers of semiconductor layers 122 for each of FET 102A and FET 102B are shown in FIG. 1B, FET 102A and FET 102B can each have any number of semiconductor layers 122.

Referring to FIGS. 1A and 1B, S/D regions 110A and 110B can be disposed adjacent to stacked fin structures 108A and 108B, respectively. In some embodiments, S/D regions 110A and 110B can have any geometric shape, such as a polygon, an ellipsis, and a circle. S/D regions 110A and 110B can include an epitaxially-grown semiconductor material. In some embodiments, the epitaxially-grown semiconductor material is the same material as substrate 406. In some embodiments, the epitaxially-grown semiconductor material includes a different material from substrate 406. In some embodiments, the epitaxially-grown semiconductor material for S/D regions 110A and 110B can be the same as or different from each other. The epitaxially-grown semiconductor material can include: (i) a semiconductor material, such as germanium and silicon; (ii) a compound semiconductor material, such as gallium arsenide and aluminum gallium arsenide; or (iii) a semiconductor alloy, such as silicon germanium and gallium arsenide phosphide. In some embodiments, S/D regions 110A and 110B can have a first width 110$w$1 along an X-axis adjacent to gate spacers 116 and a second width 110$w$2 along an X-axis adjacent to backside contact structures 104A and 104B. In some embodiments, first width 110$w$1 can be larger than second width 110$w$2 and a ratio of first width 110$w$1 to second width 110$w$2 can range from about 1.1 to about 5.

In some embodiments, S/D region 110A can be n-type for FET 102A (also referred to as "n-type S/D region 110A") and S/D region 110B can be p-type for FET 102B (also referred to as "p-type S/D region 110B"). In some embodiments, n-type S/D region 110A can include Si and can be in-situ doped during an epitaxial growth process using n-type dopants, such as phosphorus and arsenic. In some embodiments, n-type S/D region 110A can have multiple n-type epitaxial fin sub-regions that can differ from each other based on, for example, doping concentration and/or epitaxial growth process conditions. In some embodiments, p-type S/D region 110B can include SiGe and can be in-situ doped during an epitaxial growth process using p-type dopants, such as boron, indium, and gallium. In some embodiments, p-type S/D region 110B can have multiple sub-regions that can include SiGe and can differ from each other based on, for example, doping concentration, epitaxial growth process conditions, and/or relative concentration of Ge with respect to Si.

Referring to FIGS. 1A and 1B, stacked fin structures 108A and 108B can be current-carrying structures for respective FET 102A and FET 102B. Channel regions of FET 102A and FET 102B can be formed in portions of their respective stacked fin structures 108A and 108B underlying gate structures and 112B. S/D regions 110A and 110B can function as source/drain regions of respective FET 102A and FET 102B.

Referring to FIGS. 1A-1E, gate structures 112A and 112B can be multi-layered structures and can be wrapped around semiconductor layers 122 of stacked fin structures 108A and 108B. In some embodiments, each of semiconductor layers 122 of stacked fin structures 108A and 108B can be wrapped around by one of gate structures 112A and 112B, respectively, and gate structures 112A and 112B can be referred to as "gate-all-around (GAA) structures" and FETs 102A and 102B can be referred to as "GAA FETs" or "GAA finFETs."

In some embodiments, gate structures 112A and 1121 can include gate dielectric layers 113 and gate electrodes 111 wrapping around semiconductor layers 122. In some embodiments, gate dielectric layers 113 can include (i) a layer of silicon oxide, silicon nitride, and/or silicon oxynitride, (ii) a high-k dielectric material, such as hafnium oxide (HfO$_2$), (iii) a negative capacitance (NC) dielectric material doped with aluminum (Al), gadolinium (Gd), silicon (Si), strontium (Sr), scandium (Sc), yttrium (Y), zirconium (Zr), lanthanum (La), or (iv) a combination thereof. The term "high-k" can refer to a high dielectric constant. In the field of semiconductor device structures and manufacturing processes, high-k can refer to a dielectric constant that is greater than the dielectric constant of SiO2 (e.g., greater than about 3.9). In some embodiments, gate dielectric layers 113 can include a single layer or a stack of insulating material layers. In some embodiments, gate electrodes 111 can include, for example, aluminum (Al), copper (Cu), tungsten (W), titanium (Ti), tantalum (Ta), titanium nitride (TN), tantalum nitride (TaN), nickel silicide (NiSi), cobalt silicide (CoSi), silver (Ag), metal alloys, or combinations thereof.

Referring to FIG. 1B, gate spacers 116 can be disposed along sidewalk of gate structures 112A and 112B, and inner spacer structures 118 can be disposed between S/D regions 110A and 110B and portions of gate structures 112A and 112B. Each of gate spacers 116 and inner spacer structures 118 can include a dielectric material, such as silicon oxide (SiO$_x$), silicon oxynitride (SiO$_y$N), silicon nitride (SiN$_x$), silicon oxycarbide (SiOC), silicon carbonitride (SiCN), silicon oxynitricarbide (SiOCN), and a combination thereof. In some embodiments, each of gate spacers 116 and inner spacer structures 118 can include a single layer or multiple layers of insulating materials. In some embodiments, gate spacers 116 and inner spacer structures 118 can isolate gate structures 112A and 112E and S/D regions 110A and 110B.

Referring to FIGS. 1A-1E, gate contact structures 114A and 1149 can connect gate structures 112A and 112B respectively to front-side power rails 105, and S/D contact structures 104A and 104B can connect S/D regions 110A and 110B respectively to backside power rails 103. In some embodiments, gate contact structures 114A and 114B can connect to gate power supply lines in front-side power rails 105. In some embodiments, both FET 102A and FET 102B can be connected to backside power rails 103, as shown in FIG. 1A-1E. S/D contact structures 104A and 104B of FETs 102A and 102B can connect to S/D power supply lines and ground lines in backside power rails 103 (also referred to as "backside contact structures 104A and 104B"), In some embodiments, one of FETs 102A and 102B can be connected to backside power rails 103 (not shown). In some embodiments, backside power rails 103 can have a thickness 103*t* ranging from about 10 to about 60 nm.

As shown in FIGS. 1A-1E, backside contact structure 104A can include a metal silicide layer 148 and a metal contact 150, and backside contact structure 104B can include an epitaxial contact structure 146, metal silicide layer 148, and metal contact 150. Metal silicide layers 148 can include metal silicides and can reduce the contact resistance between respective metal contacts 150 and corresponding S/D regions of FETs 102A and 102B. Examples of metals used for forming the metal silicide can include cobalt (Co), titanium (Ti), nickel (Ni), ruthenium (Ru), tungsten (W), Bismuth (Bi), or germanium-tin (GeSn). In some embodiments, metal silicide layers 148 can have a thickness 148*t* ranging from about 3 nm to about 5 nm. If thickness 148*t* is less than about 3 nm, the contact resistance between S/D regions 110A and 110B and metal contacts 150 may not be reduced. If thickness 148*t* is greater than about 5 nm, the dimensions of metal contacts 150 can be reduced and the resistance of backside contact structures 104A and 104B may be increased due to higher resistivity of metal silicides than metals. Metal contacts 150 can include metals, for example, tungsten (W), cobalt (Co), aluminum (Al), copper (Cu), ruthenium. (Ru), rhodium (Rh), iridium (Ir), titanium (Ti), tantalum (Ta), silver (Ag), metal alloys, or other suitable metals. In some embodiments, metal contacts 150 can have a vertical dimension 150*h* (e.g., height) along a Z-axis ranging from about 10 nm to about 60 nm. In some embodiments, metal contacts 150 can have a horizontal dimension 150*w* (e.g., width) along an X-axis ranging from about 20 nm to about 40 nm. In some embodiments, as shown in FIG. 1C, an angle 150*j* between sidewalk and a bottom surface of metal contacts 150 can range from about 80 degrees to about 89 degrees.

In some embodiments, epitaxial contact structure 146 can include a first portion 146-1 in contact with S/D region 110B of FET 102B and a second portion 146-2 capping over first portion 146-1. Epitaxial contact structure 146 can include semiconductor materials similar to S/D region 110B epitaxially grown at a temperature ranging from about 350° C. to about 450° C. If the temperature is lower than about 350° C., the growth rate of the semiconductor materials may not be high enough for manufacturing processes. If the temperature is higher than about 450° C., the metals in front-side power rails 105 may diffuse and decrease device performance. In some embodiments, the semiconductor materials can be in-situ doped during its epitaxial growth process using: (i) p-type dopants, such as boron, indium, and gallium; and/or (ii) n-type dopants, such as phosphorus, arsenic, and antimony. In some embodiments, epitaxial contact structure 146 can include an active dopant at a concentration higher than about $1\times10^{21}$ cm$^{-3}$ to reduce the resistance of epitaxial contact structure 146.

In some embodiments, first portion 146-1 of epitaxial contact structure 146 can have a horizontal dimension 146*w*1 (e.g., width) along an X-axis ranging from about 8 nm to about 20 nm, Second portion 146-2 of epitaxial contact structure 146 can have a horizontal dimension 146*w*2 (e.g., width) along an X-axis ranging from about 8 nm to about 30 nm. In some embodiments, a ratio of horizontal dimension 146*w*2 to horizontal dimension 146*w*1 can range from about 1.1 to about 3. If the ratio is less than about 1.1, the contact resistance between S/D region 110B and metal contact 150 may not be reduced. If the ratio is greater than about 3, the dimensions of metal contact 150 can be reduced and the resistance of backside contact structure 104B may increase. In some embodiments, S/D region 110B can have a recess 110*r* at the interface between epitaxial contact structure 146 and S/D region 110B ranging from about 0 nm to about 10 nm. In some embodiments, S/D region 110B can have no recess.

Second portion 146-2 of epitaxial contact structure 146 can have any geometric shape. In some embodiments, second portion 146-2 of epitaxial contact structure 146 can have a rounded top surface and horizontal dimension 146*w*2 can be a diameter of second portion 146-2, as shown in FIG. 1C, In some embodiments, second portion 146-2 of epitaxial contact structure 146 can have one or more sloped facets and horizontal dimension 146*w*2 can be a width of second portion 146-2 over first portion 146-1, as shown in FIG. 1D. In some embodiments, epitaxial contact structure 146 with one or more sloped facets can have horizontal dimension 146*w*2 (e.g., width) ranging from about 8 nm to about 30 nm. In some embodiments, epitaxial contact structure 146 with one or more sloped facets can have a vertical dimension 146*h*2 (e.g., height) along a Y-axis ranging from about 2.5 nm to about 25 nm. An angle 146*j* between the one or more facets and first portion 146-1 can range from about 30 degrees to about 70 degrees, as shown in FIG. 1D.

In some embodiments, metal silicide layers 148 can include a metal silicide (e.g., titanium silicide) that has a low SBH (e.g., about 0.1 eV) and contact resistance on n-type S/D region 110A. Compared with FET's without epitaxial contact structures, semiconductor device 100 with epitaxial contact structure 146 on p-type S/D region 110B can reduce contact resistances of backside contact structure 104B by about 30% to about 70% without increasing contact resistances of backside contact structure 104A.

Referring to FIGS. 1A-1E, semiconductor device 100 can further include a barrier layer 115, a first interlayer dielectric (ILD) layer 120, a second ILD layer 124, a third ILD layer 128, an etch stop layer (ESL) 126, a capping layer 130, a bonding layer 132, a carrier substrate 134, a backside ILD layer 136, a backside ESL 138, a backside barrier layer 140, and backside dielectric structure 144.

Barrier layer 115 and backside barrier layer 140 can include a dielectric material to isolate gate structures 112 and backside contact structures 104A and 104B from surrounding structures. In some embodiments, barrier layer 115 and backside barrier layer 140 can include silicon nitride. In some embodiments, backside barrier layer 140 can have a thickness 140*t* ranging from about 1 nm to about 3 nm. Each of first ILD layer 120, second ILD layer 124, third ILD layer 128, and backside ILD layer 136 can include a dielectric material deposited using a deposition method suitable for flowable dielectric materials (e.g., flowable silicon oxide, flowable silicon nitride, flowable silicon oxynitride, flowable silicon carbide, flowable silicon oxycarbide, or flowable silicon oxynitricarbide). In some embodiments, the dielectric material can be silicon oxide. In some embodiments, backside ILD layer 136 can have a thickness 136*t* ranging from about 0 nm to about 40 nm. In some embodiments, semiconductor device 100 may not include backside ILD layer 136.

ESL 126 and backside ESL 138 can protect underlying structures from etching during the formation of contact structures. In some embodiments, ESL 126 and backside ESL 138 can include, for example, silicon nitride (SiN$_x$), silicon oxide (SiO$_x$), silicon oxynitride (SiON), aluminum oxide (AlO$_x$), or a combination thereof. In some embodiments, the dielectric material can be silicon oxide. In some embodiments, backside ESL 138 can have a thickness 138$t$ ranging from about 10 nm to about 30 nm.

Backside dielectric structure 144 can isolate backside contact structures 104A, 104B, and other adjacent contact structures. In some embodiments, backside dielectric structure 144 can include a dielectric material deposited using a deposition method suitable for flowable dielectric materials (e.g., flowable silicon oxide, flowable silicon nitride, flowable silicon oxynitride, flowable silicon carbide, or flowable silicon oxycarbide).

Capping layer 130 can protect front-side power rails 105 and include a dielectric material, such as silicon nitride (SiN$_x$), silicon oxide (SiO$_x$), silicon oxynitride (SiON), and a combination thereof. Bonding layer 132 can include silicon oxide or other suitable materials to bond carrier substrate 134 to substrate 406, Carrier substrate 134 can include semiconductor materials similar to or different from substrate 406. In some embodiments, carrier substrate 134 can include silicon.

Figures 2A, 2B:
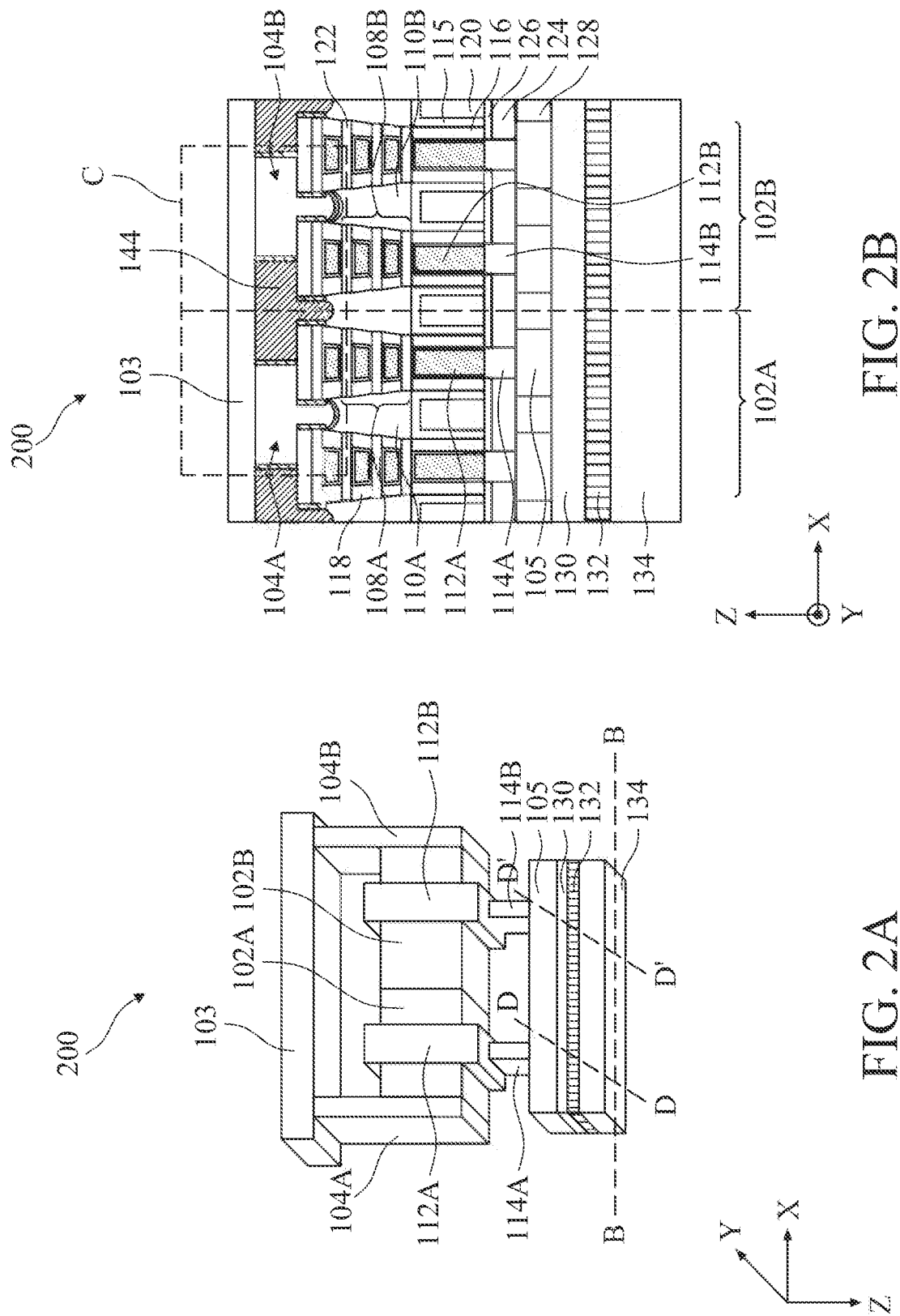
FIGS. 2A, 2B, 2C, and 2D illustrate an isometric view and various cross-sectional views of a semiconductor device with backside contact structures having dual metal silicide layers, in accordance with some embodiments.
Figure 2C:
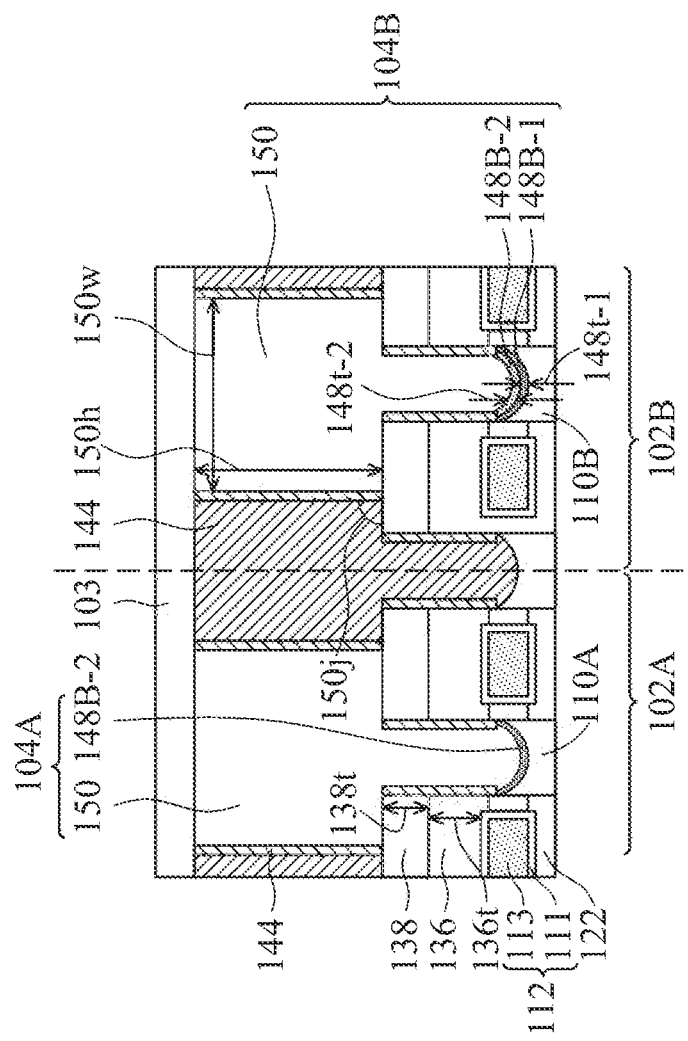
Figure 2D:
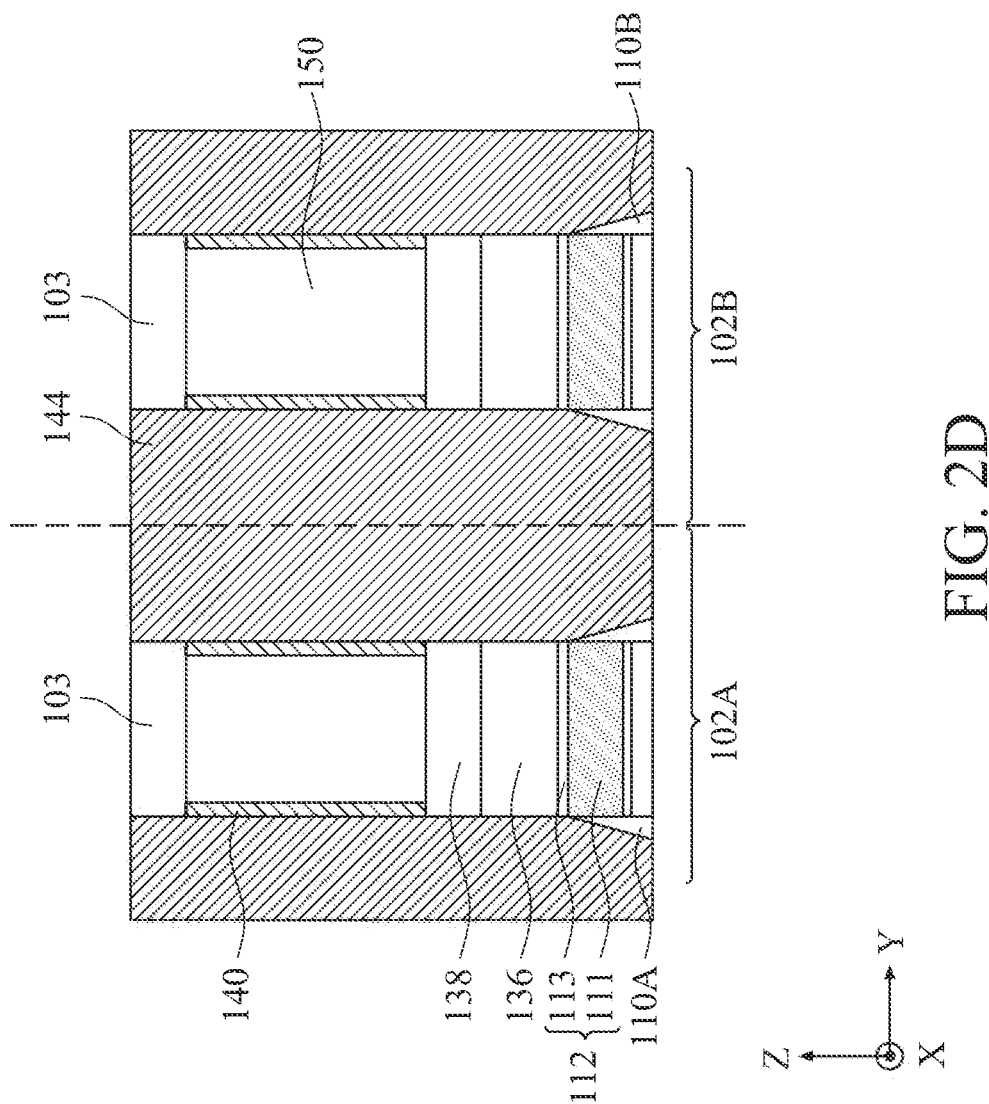

FIG. 2A illustrates an isometric view of a semiconductor device 200 with backside contact structures having dual metal silicide layers, in accordance with some embodiments. FIG. 2B illustrates a cross-sectional view of semiconductor device 200 along line B-B in FIG. 2A, in accordance with some embodiments. FIG. 2C illustrates region C in FIG. 29, according to some embodiments. FIG. 2D illustrate partial cross-sectional views of semiconductor device 200 along line D-D or FET 102A and D'-D' for FET 102B in FIG. 2A, according to some embodiments. Elements in FIGS. 2A-2D with the same annotations as elements in FIGS. 1A-1E are described above.

As shown in FIGS. 2A-2D, backside contact structure 104B can include a first metal silicide layer 148B-1, a second metal silicide layer 148B-2, and metal contact 150. Backside contact structure 104B can include second metal silicide layer 148B-2 and metal contact 150. In some embodiments, first and second metal silicide layers 148B-1 and 148B-2 can include a different metal silicide. In some embodiments, second metal silicide layer 148B-2 can include a metal silicide (e.g., titanium silicide) that has a low (e.g., about 0.1 eV) and contact resistance on n-type S/D region 110A. First metal silicide layer 148B-1 can include a metal silicide (e.g., nickel silicide) that has a low SBH (e.g., about 0.1 eV) and contact resistance on p-type S/D region 110B. As a result, semiconductor device 200 can have low contact resistances for both NFETs and PFETs. Compared with a same metal silicide on both NFETs and PFETs, semiconductor device 200 with different metal silicide on different type of FETs can reduce contact resistances of backside contact structure 104B by about 30% to about 70% without increasing contact resistances of backside contact structure 104A.

In some embodiments, first metal silicide layer 148B-1 can have a thickness 148$t$-1 ranging from about 0.1 nm to about 3 nm. In some embodiments, second metal silicide layer 148B-2 can have a thickness 148$t$-2 ranging from about 3 nm to about 5 nm. A ratio of thickness 148$t$-1 to 148$t$-2 can range from about 0.02 to about 1. If thickness 148$t$-1 is less than about 0.1 nm, or the ratio is less than about 0.02, first metal silicide layer 148B-1 may not reduce contact resistance between backside contact structure 104B and S/D region 110B. If thickness 148$t$-1 is greater than about 3 nm, or the ratio is greater than about 1, resistances of first metal silicide layers 148B-1 may increase and the resistance of backside contact structure 104B may increase.

Figure 3:
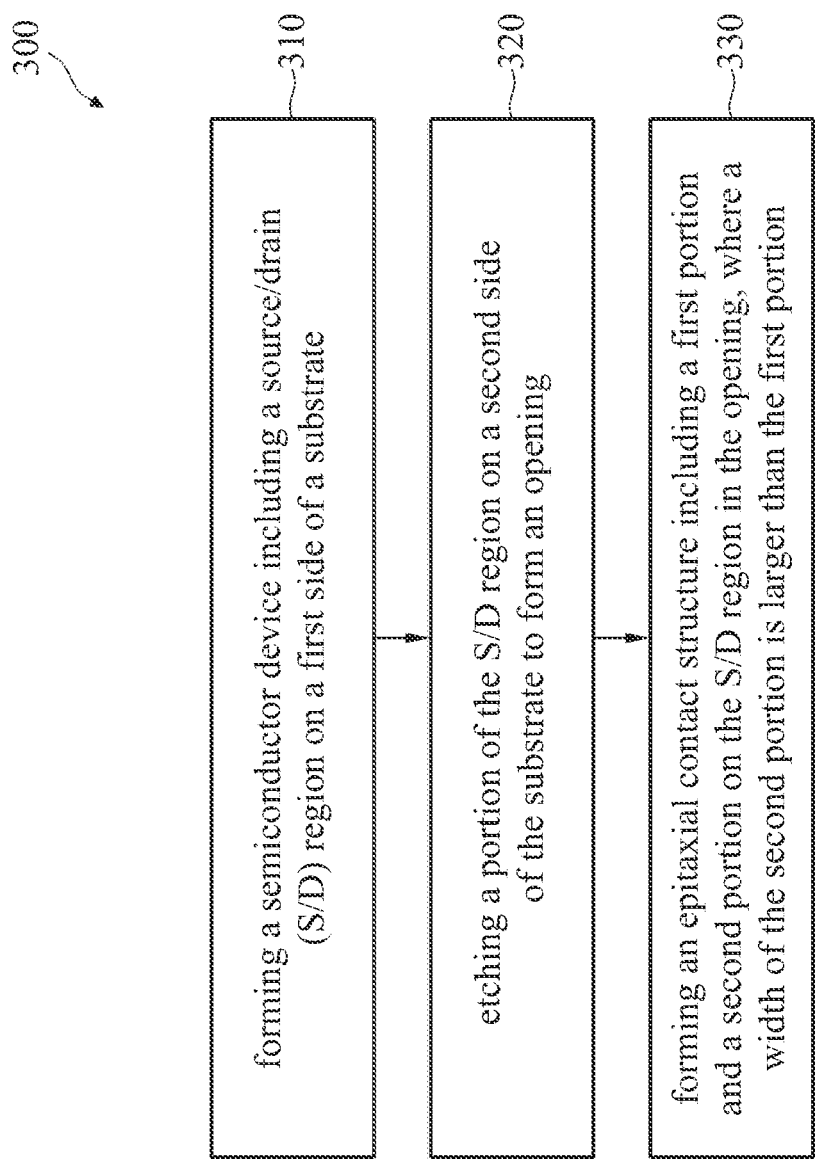
FIG. 3 is a flow diagram of a method for fabricating a semiconductor device with backside contact structures having an epitaxial contact structure, in accordance with some embodiments.

FIG. 3 is a flow diagram of a method 300 for fabricating semiconductor device 100 with backside contact structures having an epitaxial contact structure, in accordance with some embodiments. Method 300 may not be limited to GAA FETs and can be applicable to devices that would benefit from backside contact structures with reduced contact resistance, such as planar FETs, fin FETs, etc, Additional fabrication operations may be performed between various operations of method 300 and may be omitted merely for clarity and ease of description. Additional processes can be provided before, during, and/or after method 300; one or more of these additional processes are briefly described herein. Moreover, not all operations may be needed to perform the disclosure provided herein. Additionally, some of the operations may be performed simultaneously or in a different order than shown in FIG. 3. In some embodiments, one or more other operations may be performed in addition to or in place of the presently described operations. For example purposes, the operations illustrated in FIG. 3 will be described with reference to the example fabrication process for fabricating semiconductor device 100 as illustrated in FIGS. 4-12, FIGS. 4-12 are cross-sectional views of semiconductor device 100. Although FIGS. 4-12 illustrate fabrication processes of semiconductor device 100 with epitaxial contact structure 146 in FET 102B, method 300 can be applied to semiconductor device 100 with epitaxial contact structures in ITT 102A and other semiconductor devices. Elements in FIGS. 4-12 with the same annotations as elements in FIGS. 1A-1E are described above.

Figure 5:
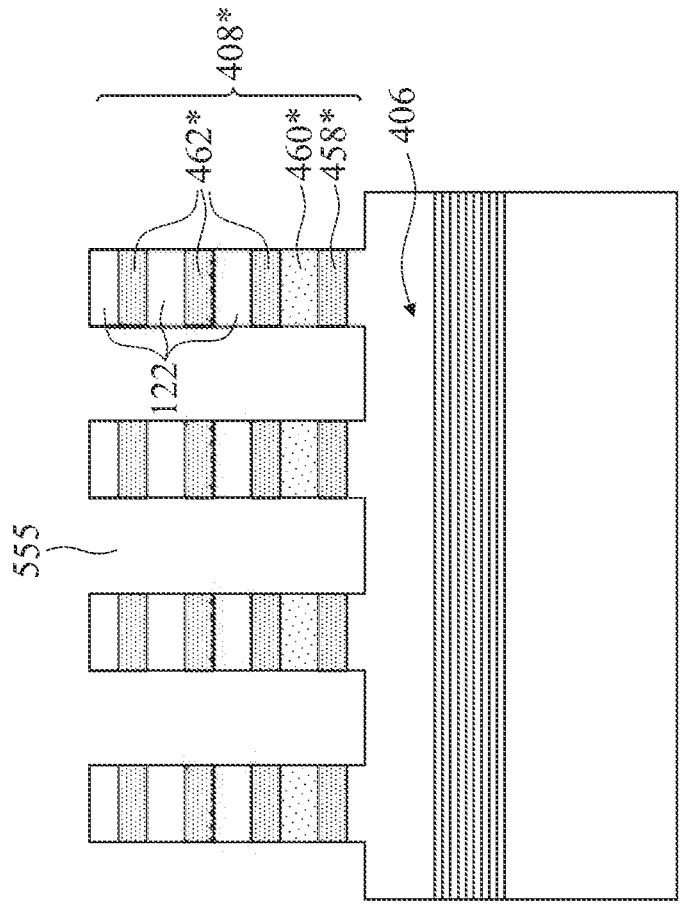
FIGS. 4-12 illustrate cross-sectional views of a semiconductor device with backside contact structures at various stages of its fabrication process having an epitaxial contact structure, in accordance with some embodiments.
Figure 4:
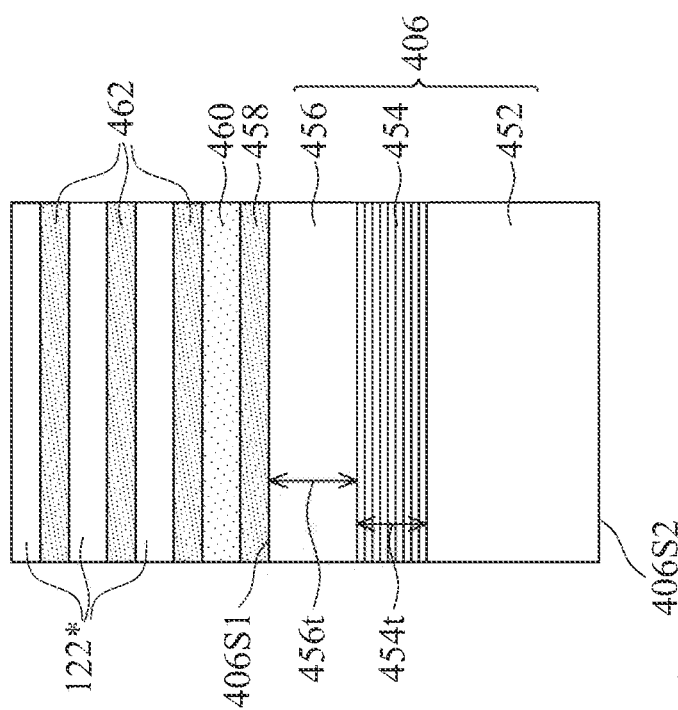

In referring to FIG. 3, method 300 begins with operation 310 of forming a semiconductor device on a first side of a substrate, where the semiconductor device includes a source/drain (S/D) region. For example, as shown in FIGS. 4-6, semiconductor device 100 includes FETs 102A and 102B that can be formed on a first side 406S1 of substrate 406. The formation of semiconductor device 100 can include formation of stacked fin structures 108* and formation of FETs 102A and 102B. Stacked fin structure 108* can be formed on first side 406S1 of substrate 406. In some embodiments, substrate 406 can be an SOI wafer and can include a bulk layer 452, an insulating layer 454, and a device layer 456. In some embodiments, bulk layer 452 can include silicon. In some embodiments, device layer 456 can include silicon and have a thickness 456$t$ ranging from about 40 nm to about 200 nm. Thickness 456$t$ can depend on requirements of devices fabricated on device layer 456. In some embodiments, insulating layer 454 can include silicon oxide and have a thickness 454$t$ ranging from about 20 nm to about 100 mm.

The formation of stacked fin structure 108* can include epitaxially growing semiconductor layers 458, 460, 462, and 122* on substrate 406 followed by a vertical etch to form openings 555, as shown in FIGS. 4 and 5. In some embodiments, semiconductor layers 458, 460, 462, and 122* can include semiconductor materials with oxidation rates and/or etch selectivity different from each other. The term "etch selectivity" can refer to the ratio of the etch rates of two different materials under the same etching conditions. In some embodiments, semiconductor layer 458 can include silicon germanium (SiGe) with Ge in a range from about 30 atomic percent to about 40 atomic percent with any remaining atomic percent being Si. In some embodiments, semiconductor layer 460 can include Si and can be in-situ doped during its epitaxial growth process. In some embodiments, semiconductor layers 462 can include silicon germanium (SiGe) with Ge in a range from about 10 atomic percent to about 20 atomic percent with any remaining atomic percent being Si. In some embodiments, semiconductor layers 122 can include Si without any substantial amount of Ge. A hard mask layer can be deposited on semiconductor layers 458, 460, 462, and 122* and patterned to form openings 555 and stacked fin structures 108* as shown in FIG. 5 by the vertical etch. In some embodiments, S/D regions can be formed in openings 555 in subsequent processes. In some embodiments, the vertical etch of semiconductor layers 458, 460, 462, and 122* can include a biased directional etching process. In some embodiments, device layer 456 can be partially etched or fully removed by the vertical etch.

The formation of semiconductor device 100 with FETs 102A and 102B can include formation of S/D regions 110A and 110B, formation of inner spacer structures 118 and gate spacers 116, formation of gate structures 112, formation of backside ESL 138 and backside ILD layer 136, formation of first, second, and third ILD layers 120, 124, and 128, formation of gate contact structures 114, formation of front-side power rails 105, and formation of capping layer 130. The details for the formation of semiconductor device 100 on first side 406S1 is omitted merely for clarity and ease of description.

Figure 7:
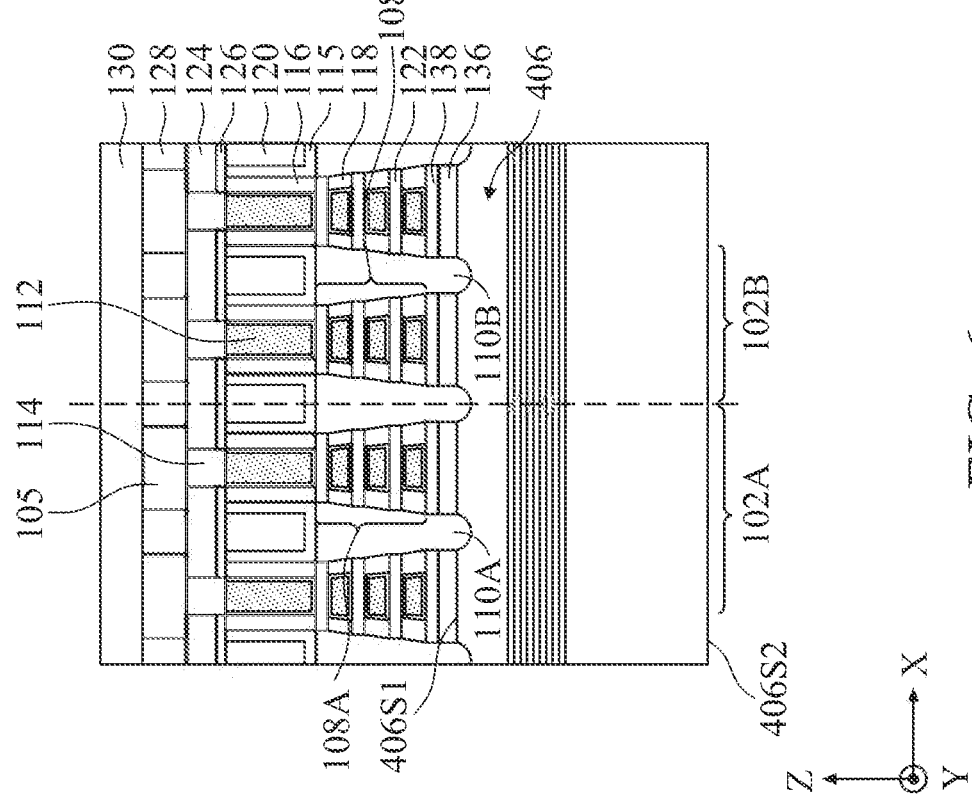

In operation 320 of FIG. 3, a portion of the S/D region on a second side of the substrate is etched to form an opening. The second side is opposite to the first side. For example, as shown in FIGS. 7-10, a portion of S/D regions 110A and 110B on a second side 406S2 of substrate 406 can be etched to form openings 1064A and 1064B. Second side 406S2 can be a back side of substrate 406 opposite to first side 406S1 having semiconductor device 100 and front-side power rails 105. Prior to etching a portion of S/D regions 110A and 110B on second side 406S2, semiconductor device 100 can be bonded to a carrier substrate 134 and backside dielectric structure 144 can be formed on second side 406S2 of substrate 406, As shown in FIG. 7, a bonding layer 132 can be formed on capping layer 130, and carrier substrate 134 can be bonded to bonding layer 132. In some embodiments, bonding layer 132 can include a dielectric material of silicon oxide deposited by a high-density plasma (HDP) deposition process. In some embodiments, bonding layer 132 can include other suitable materials to bond carrier substrate 134 to capping layer 130. In some embodiments, carrier substrate 134 and bonding layer 132 can be bonded together by a pressure bonding process.

Figure 8B:
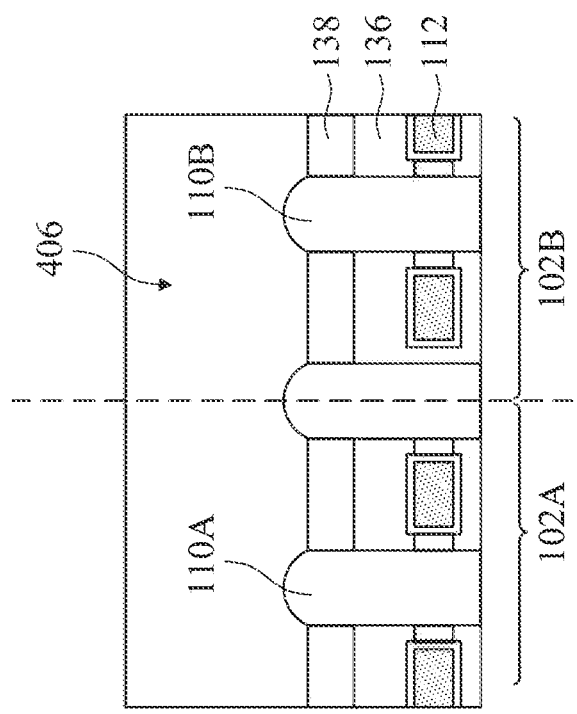
Figure 8A:
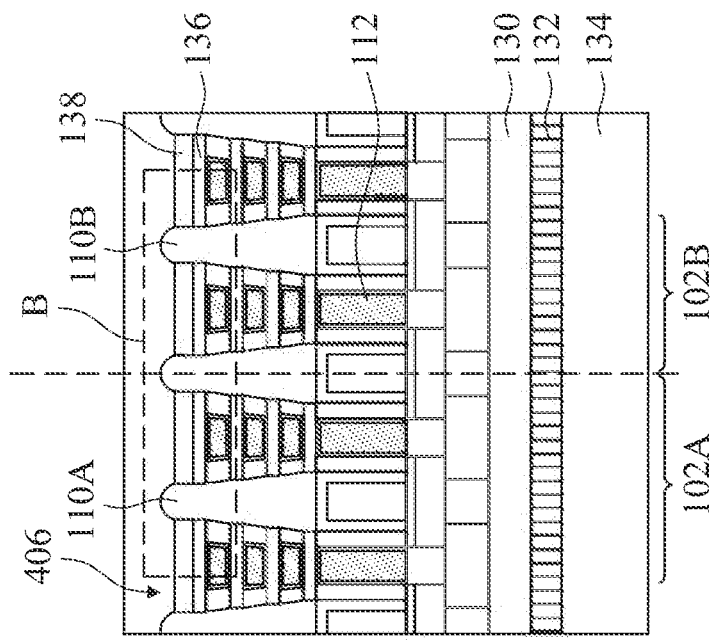

The bonding of carrier substrate 134 to bonding layer 132 can be followed by flipping substrate 406 above carrier substrate 134 and a substrate polishing process on second side 406S2 of substrate 406, as shown in FIGS. 8A and 8B. FIG. 8B is an enlarged cross-sectional view of region B shown in FIG. 8A. In some embodiments, the substrate polishing process can include a grinding process, a trimming process, a thinning process, and a chemical mechanical polishing (CMP) process. After the substrate polishing process, substrate 406 can have a thickness ranging from about 100 nm to about 1 μm. A patterning process can be performed on second side 406S2 to form backside contact structures.

Figure 9:
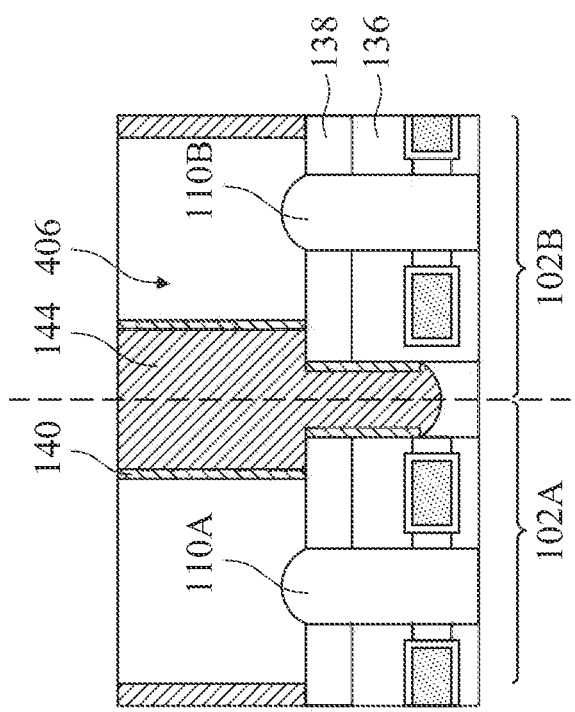

The bonding of semiconductor device 100 to carrier substrate 134 can be followed by the formation of backside dielectric structure 144, as shown in FIG. 9. A mask layer can be deposited on second side 406S2 of substrate 406 and the mask layer can be patterned to mask substrate 406 above S/D regions 110A and 110B. Substrate 406 can be removed from connected S/D regions of FETs 102A and 102B to form an opening. Backside barrier layer 140 can be formed on sidewalk of the opening and backside dielectric structure 144 can fill the opening. In some embodiments, backside barrier layer 140 can be conformally deposited in the opening and a portion of backside barrier layer 140 can be selectively etched on the connected S/D regions of FETs 102A and 102B by a directional etching process. In some embodiments, backside dielectric structure 144 can be deposited using a deposition method suitable for flowable dielectric materials. In some embodiments, backside dielectric structure 144 can include flowable oxide, flowable silicon nitride, flowable silicon oxynitride, flowable silicon carbide, or flowable silicon oxycarbide. In some embodiments, backside dielectric structure 144 can isolate FETs 102A and 102B, and other adjacent devices and structures.

Figure 10:
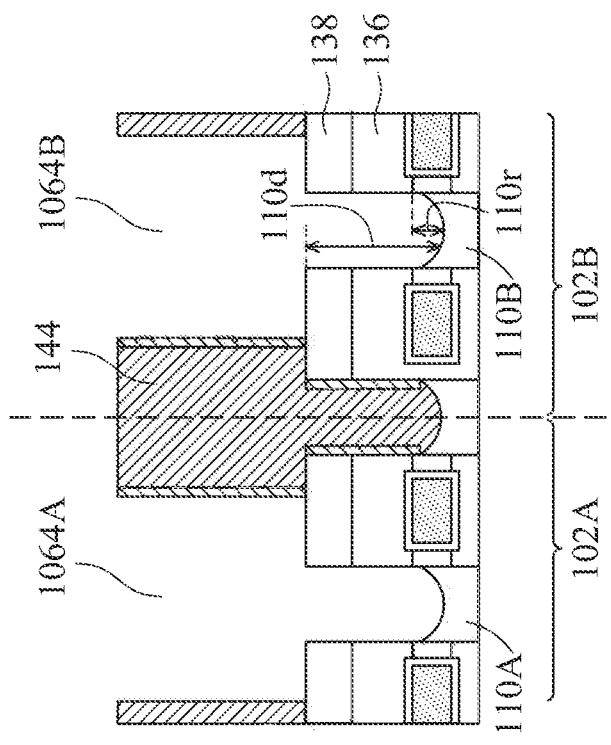

The formation of backside dielectric structure 144 can be followed by etching a portion of S/D regions 110A and 110B, as shown in FIG. 10, Substrate 406 above S/D regions 110A and 110B can be etched and a portion of S/D regions 110A and 110B can be etched to form openings 1064A and 1064B, In some embodiments, the etching process can include a directional etching process, such as a reactive ion etching (RIE) process. In some embodiments, each of S/D regions 110A and 110E can be etched with a depth 110$d$ ranging from about 10 nm to about 80 nm. In some embodiments, a top surface of S/D regions 110A and 110B after the etching process can have a rounded surface due to process variations, Recess 110$r$ at the top surface can range from about 0 nm to about 10 nm.

Figure 12:
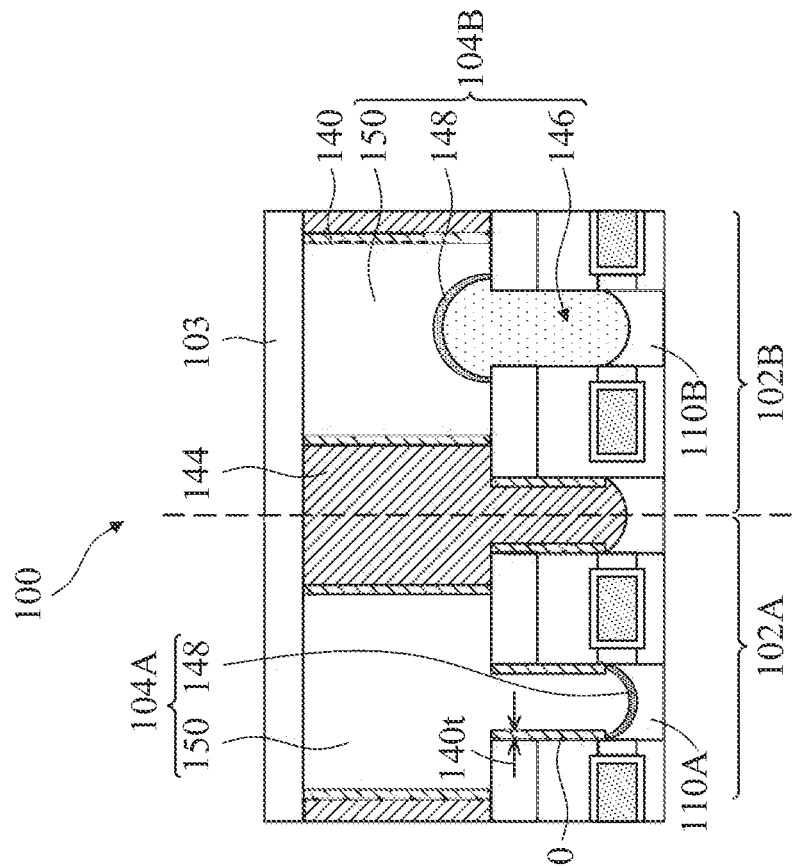
Figure 11:
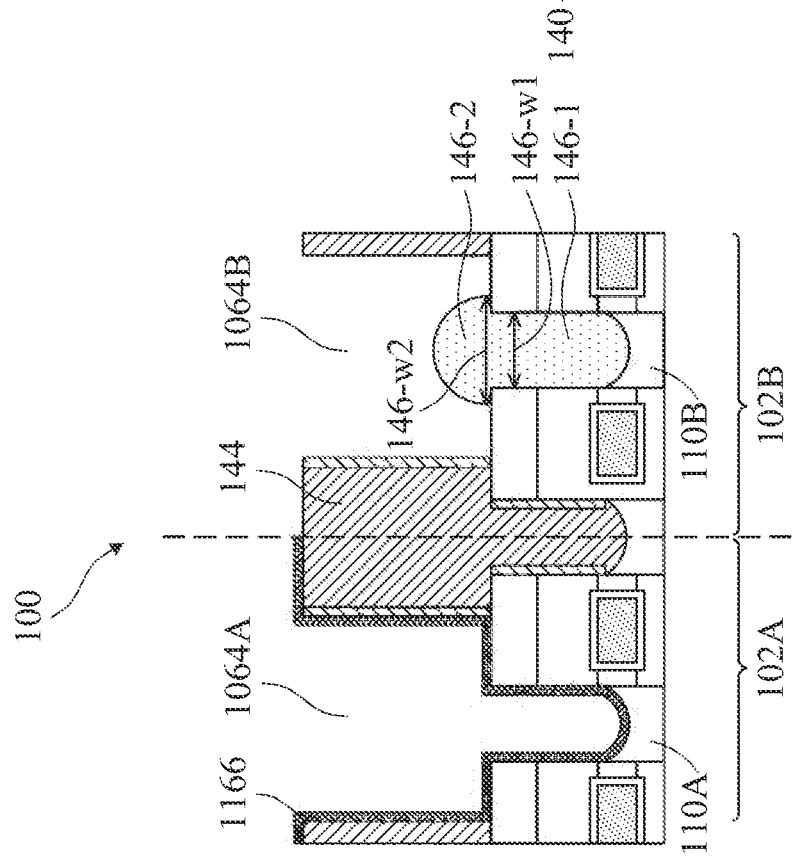

In operation 330 of FIG. 3, an epitaxial contact structure can be formed on the S/D region. The epitaxial contact structure can include a first portion and a second portion and the width of the second portion is larger than the first portion. For example, as shown in FIGS. 11 and 12, epitaxial contact structure 146 can be formed on S/D region 110B. Epitaxial contact structure 146 can include first portion 146-1 and second portion 146-2. First portion 146-1 can have a width smaller than the width of second portion 146-2. Prior to the formation of epitaxial contact structure 146, a hard mask layer 1166 can be deposited and patterned to cover the top surface of S/D region 110A and exposed surfaces of FET 102A. In some embodiments, hard mask layer 1166 can block S/D region 110A while forming epitaxial contact structure 146 on S/D region 110B. In some embodiments, hard mask layer 1166 can include aluminum oxide, silicon nitride, or other suitable dielectric materials and have a thickness ranging from about 3 nm to about 5 nm. Epitaxial contact structure 146 can be epitaxially grown on S/D region 110B in opening 1064B.

In some embodiments, epitaxial contact structure 146 can be deposited on S/D region 110E at a temperature ranging from about 350° C., to about 450° C. under a pressure ranging from about 5 Torr to about 300 Torr. In some embodiments, epitaxial contact structure 146 can be deposited at a deposition rate ranging from about 0.1 nm/min to about 5 nm/min. If the temperature is lower than about 350° C., or the pressure is lower than about 5 Torr, or the deposition rate is less than about 0.1 nm/min, the growth rate of epitaxial contact structure 146 may be lower than the requirement of semiconductor manufacturing processes. If the temperature is higher than about 450° C., metals in front-side interconnects and power rails may diffuse and device performance may be degraded. If the pressure is higher than about 300 Torr, or the deposition rate is higher than about 5 nm/min, epitaxial contact structure 146 may have more defects.

In some embodiments, epitaxial contact structure 146 can be epitaxially grown on p-type S/D regions using precursors including a silicon precursor, a germanium precursor, and a doping precursor. The silicon precursor can include silane ($SiH_4$) or disilane ($Si_2H_6$). The germanium precursor can include germane ($GeH_4$), digermane ($Ge_2H_6$), or germanium tetrachloride ($Ge_2Cl_4$). The doping precursor can include diborane ($B_2H_6$) or other p-type doping precursor. The deposition process can further include a selectivity gas of hydrogen chloride (HCl) and a carrier gas of nitrogen or hydrogen. The selectivity gas can remove porous epitaxial structures grown on areas other than S/D regions and improve the selectivity of the epitaxial growth on S/D regions. The carrier gas can carry the precursors during the epitaxial process. In some embodiments, epitaxial contact structure 146 can include an active dopant higher than about $1 \times 10^{21}$ $cm^{-3}$ to reduce its resistance.

In some embodiments, epitaxial contact structure 146 can be epitaxially grown on n-type S/D regions using precursors including a silicon precursor and a doping precursor. The silicon precursor can include silane ($SiH_4$) or disilane ($Si_2H_6$). The doping precursor can include phosphine ($PH_3$), arsine ($AsH_3$), or other it-type doping precursor. The deposition process can further include a selectivity gas of hydrogen chloride (HCl) or chlorine ($Cl_2$) and a carrier gas of nitrogen or hydrogen. The selectivity gas can improve the selectivity of the epitaxial process. The carrier gas can carry the precursors during the epitaxial process. In some embodiments, epitaxial contact structure 146 can include an active dopant higher than about $1 \times 10^{21}$ $cm^{-3}$ to reduce its resistance.

According to some embodiments, first portion 146-1 can be a plug portion of epitaxial contact structure 1146 in contact with S/D region 110B in opening 1064B. Second portion 146-2 can be cap portion of epitaxial contact structure 146 on first portion 146-1. In some embodiments, horizontal dimension 146w1 of first portion 146-1 of epitaxial contact structure 146 can range from about 8 nm to about 20 nm. Horizontal dimension 146w2 of epitaxial contact structure 146 can range from about 8 nm to about 30 nm. In some embodiments, the ratio of horizontal dimensions 146w2 to 146w1 can range from about 1 to about 3. In some embodiments, second portion 146-2 can have one or more sloped facets capping first portion 146-1, as shown in FIG. 1D. In some embodiments, second portion 146-2 can have a rounded top surface capping on first portion 146-1, as shown in FIGS. 1C and 11. Epitaxial contact structure 146 can be grown by a cyclic deposition/etch process. The repeated cycles of deposition and etching can result in a rounded profile as illustrated in FIGS. 1C and 11. In some embodiments, the rounded profile is not a perfect circular shape; the cross-sectional profile may vary.

The formation of epitaxial contact structure 146 can be followed by removal of mask layer 1166, formation of backside barrier layer 140, formation of metal silicide layers 148, and formation of metal contacts 150. Mask layer 1166 can be removed by an etching process. Backside barrier layer 140 can be conformally deposited in openings 1064A and 1064B, followed by a directional etching process to expose top surfaces of S/D region 110A and epitaxial contact structure 146. In some embodiments, backside barrier layer 140 can have a thickness 140t ranging from about 1 nm to about 3 nm. Backside barrier layer 140 can prevent metal diffusion during the formation of metal contacts 150.

The formation of backside barrier layer 140 can be followed by the formation of metal silicide layers 148. In some embodiments, metal silicide layers 148 can be deposited and annealed at a temperature below about 450° C. In some embodiments, metal layers 148 can include metals having lower SBH (e.g., about 0.1 eV) and lower contact resistance on S/D region 110A. Examples of the metals used for forming metal silicide layers 148 can include Ti. The formation of metal silicide layers 148 can be followed by the formation of metal contacts 150. Metal contacts 1150 can be formed by chemical vapor deposition (CVD) or other suitable deposition methods. In some embodiments, metal contacts 150 can include conductive materials with low resistivity, such as W, Al, Co, Ru, Rh, Ir, Ti, Ta, Ag, metal alloys, and other suitable metals.

Figure 16:
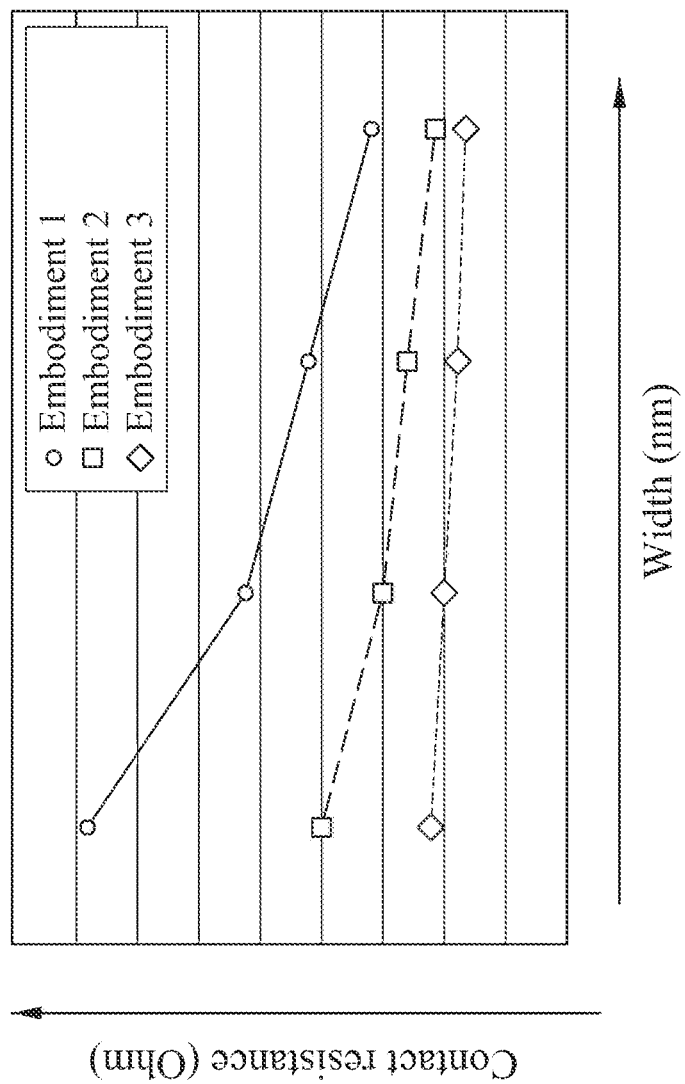
FIG. 16 illustrates a relationship between contact resistances of a backside contact structure and a width of the backside contact structure, in accordance with some embodiments.

In some embodiments, epitaxial contact structure 146 can reduce the contact resistance of backside contact structure 104B between S/D region 110B and metal contacts 150. For example, as shown in FIG. 16, embodiment 1 can include no epitaxial contact structures and embodiments 2 and 3 can include epitaxial contact structure 146 with high concentration of active dopants (e.g., higher than about $1 \times 10^{21}$ $cm^{-3}$). The width axis in FIG. 16 can be a horizontal dimension of S/D regions 110E (e.g., 146w1) for embodiment 1 and horizontal dimension 146w2 of epitaxial contact structure 146 for embodiment 2 (as shown in FIG. 1C). Compared with embodiment 1 at the same width, embodiment 2 can reduce the contact resistance by about 30% to about 70% via epitaxial contact structure 146 with a high active dopant concentration. In addition, with the increase of the width of epitaxial contact structure 146 (e.g., 146w2), the contact resistance of embodiment 2 can further reduce because of the increased contact area at the interface between epitaxial contact structure 146 and metal silicide layer 148. Embodiment 3 can include epitaxial contact structure 146 with a different flow to optimize the dimensions of epitaxial contact structure 146 and to further reduce the contact resistance. In some embodiments, epitaxial contact structure 146 may be in contact with backside ILD layer 136 and backside ESL 138. Epitaxial contact structure 146 may not include metals that can diffuse into backside ILD layer 136 and backside ESL 138, thereby backside barrier layer may not be needed between epitaxial contact structure 146 and backside ILD layer 136 and between epitaxial contact structure 146 and backside ESL 138. As such, horizontal dimension 146w1 of epitaxial contact structure 146 can increase, the resistance of epitaxial contact structure 146 can be reduced, and the contact resistance of backside contact structure 104B can be reduced.

Figure 13:
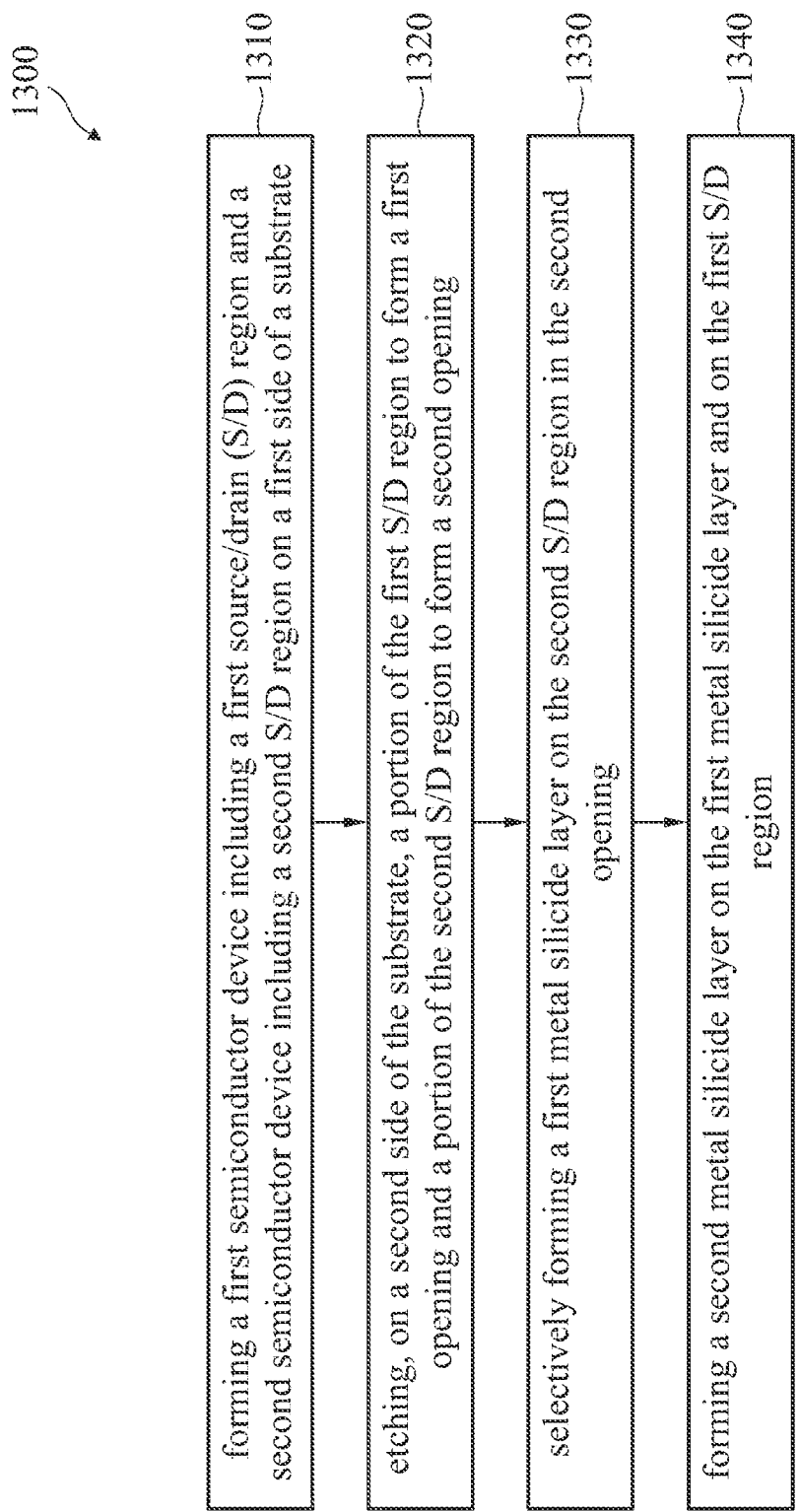
FIG. 13 is a flow diagram of a method for fabricating a semiconductor device with backside contact structures having dual metal silicide layers, in accordance with some embodiments.

FIG. 13 is a flow diagram of a method 1300 for fabricating semiconductor device 200 with backside contact structures having dual metal silicide layers, in accordance with some embodiments. Method 1300 may not be limited to GAA FETs and can be applicable to devices that would benefit from backside contact structures with reduced contact resistance, such as planar FETs, fin FETs, etc. Additional fabrication operations may be performed between various operations of method 1300 and may be omitted merely for clarity and ease of description. Additional processes can be provided before, during, and/or after method 1300; one or more of these additional processes are briefly described herein. Moreover, not all operations may be needed to perform the disclosure provided herein. Additionally, some of the operations may be performed simultaneously or in a different order than shown in FIG. 13. In some embodiments, one or more other operations may be performed in addition to or in place of the presently described operations. For example purposes, the operations illustrated in FIG. 13 can be described with reference to the example fabrication process for fabricating semiconductor device 200 as illustrated in FIGS. 4-10 and 14-15. FIGS. 4-10 and 14-15 can be cross-sectional views of semiconductor device 200 with backside contact structures having dual metal silicide layers at various stages of its fabrication process, in accordance with some embodiments. Although FIGS. 4-10 and 14-15 illustrate fabrication processes of semiconductor device 200 with dual metal silicide layers in FEY 102B, method 1300 can be applied to semiconductor device 200 with dual metal silicide layers in FET 102A and other semiconductor devices, Elements in FIGS. 14-15 with the same annotations as elements in FIGS. 1A-1E and 4-10 are described above.

Referring to FIG. 13, operations 1310 and 1320 are similar to operations 310 and 320 respectively, which are described above with reference to FIGS. 4-10. For example, in operation 1310, FET 102A including S/D region 110A and FET 102B including S/D region 110E can be formed on first side 406S1 of substrate 406. In operation 1320, a portion of S/D region 110A can be etched on second side 406S2 of substrate 406 to form opening 1064A and a portion of S/D region 110B can be etched on second side 406S2 to form opening 1064B.

Figure 14:
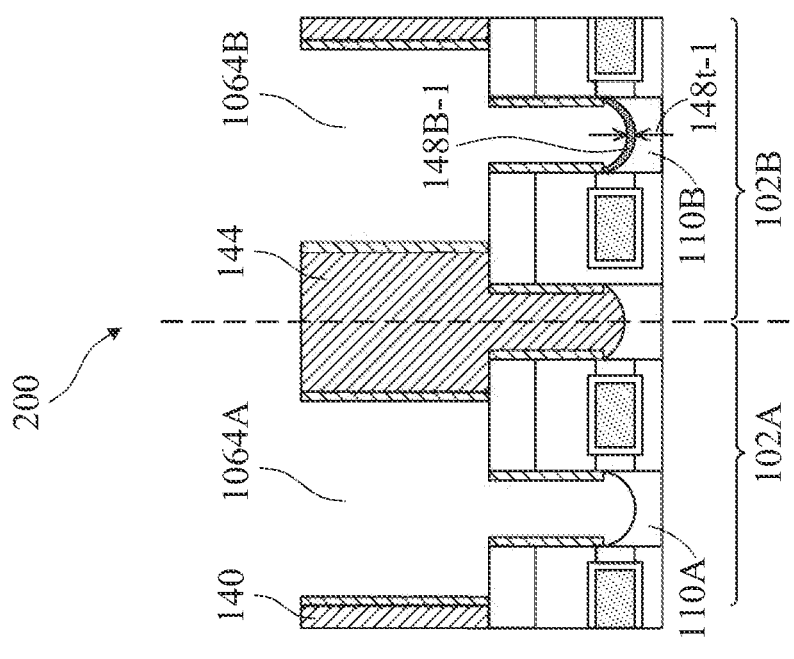

In referring to FIG. 13, operation 1330 continues with the process of selectively forming a first metal silicide layer on the second S/D region in the second opening. For example, as shown in FIG. 14, first metal silicide layer 148B-1 can be selectively formed on S/D region 1109 in opening 1064B without a mask layer and a patterning process (also referred to as "maskless metal silicide layer 1489-1"). In some embodiments, first metal silicide layer 148B-1 can include metals having lower SBH (e.g. 0.1 eV) and lower contact resistance on S/D region 110B. Examples of the metals used for forming first metal silicide layer 1488-1 can include Ni, Ru, and Co. In some embodiments, first metal silicide layer 148B-1 can have a thickness 148*t*-1 ranging from about 0.1 nm to about 3 nm. Prior to the selective formation of first metal silicide layer 148B-1, backside barrier layer 140 can be can be conformally deposited in openings 1064A and 1064B, followed by a directional etching process to expose top surfaces of S/D regions 110A and 110B. In some embodiments, backside barrier layer 140 can include silicon nitride and have a thickness 140*t* ranging from about 1 nm to about 3 nm. Backside barrier layer 140 can prevent metal diffusion during the formation of metal contacts 150.

In some embodiments, first metal silicide layer 148B-1 can be selectively deposited on S/D region 110B by atomic layer deposition (ALD), CVD, or other suitable methods. A selectivity between S/D region 110B and S/D region 110A can range from about 5 to about 15. In some embodiments, first metal silicide layer 148B-1 can be formed by thermal ALD with ammonia (NH$_3$) using a precursor of Ni at a temperature from about 150° C. to about 250° C. under a pressure from about 1 mTorr to about 100 mTorr. The deposition rate can range from about 0.1 Å/cycle to about 1.0 Å/cycle and the deposition cycles can range from about 200 to about 600. The deposited metal can be annealed under a temperature below 400° C. to form first metal silicide layer 148B-1. If the temperature is lower than about 150° C., the pressure is lower than about 1 mTorr, the deposition rate is less than 0.1 Å/cycle, or the deposition cycles are less than about 200, first metal silicide layer 148B-1 may not be continuous. If the temperature is higher than about 250° C., the pressure is higher than about 100 mTorr, the deposition rate is greater than 1.0 Å/cycle, or the deposition cycles are greater than about 600, first metal silicide layer 148B-1 may be thicker than required and can increase the contact resistance between S/D region 110B and metal contact 150. If the annealing temperature is higher than about 400° C., metals in front-side interconnects and power rails may diffuse and device performance may be negatively impacted.

In some embodiments, first metal silicide layer 148B-1 can be formed by thermal, ALD with an oxidizing agent using a precursor of Ru at a temperature from about 150° C. to about 300° C. under a pressure from about 1 mTorr to about 100 mTorr. The deposition rate can range from about 0.1 Å/cycle to about 1.0 Å/cycle and the deposition cycles can range from about 50 to about 300. The deposited metal can be annealed under a temperature below 400° C. to form first metal, silicide layer 148B-1. If the temperature is lower than about 150° C., the pressure is lower than about 1 mTorr, the deposition rate is less than 0.1 Å/cycle, or the deposition cycles are less than about 50, first metal silicide layer 148B-1 may not be continuous. If the temperature is higher than about 300 the pressure is higher than about 100 mTorr, the deposition rate is greater than 1.0 Å/cycle, or the deposition cycles are greater than about 300, first metal silicide layer 148B-1 may be thicker than required and can increase the contact resistance between S/D region 110B and metal contact 150. If the annealing temperature is higher than about 400° C., metals in front-side interconnects and power rails may diffuse and device performance may be negatively impacted.

In some embodiments, first metal silicide layer 148B-1 can be formed by thermal ALD with ammonia (NH$_3$) using a precursor of Co at a temperature from about 200° C. to about 350° C. under a pressure from about 1 mTorr to about 100 mTorr. The deposition rate can range from about 0.1 Å/cycle to about 1.0 Å/cycle and the deposition cycles can range from about 200 to about 600. The deposited metal can be annealed under a temperature below 400° C. to form first metal silicide layer 148B-1. If the temperature is lower than about 200° C., the pressure is lower than about 1 mTorr, the deposition rate is less than 0.1 Å/cycle, or the deposition cycles are less than about 200, first metal silicide layer 148B-1 may not be continuous. If the temperature is higher than about 350° C., the pressure is higher than about 100 mTorr, the deposition rate is greater than 1.0 Å/cycle, or the deposition cycles are greater than about 600, first metal silicide layer 148B-1 may be thicker than required and can increase the contact resistance between S/D region 110B and metal contact 150. If the annealing temperature is higher than about 400° C., metals in front-side interconnects and power rails may diffuse and device performance may be negatively impacted.

Figure 15:
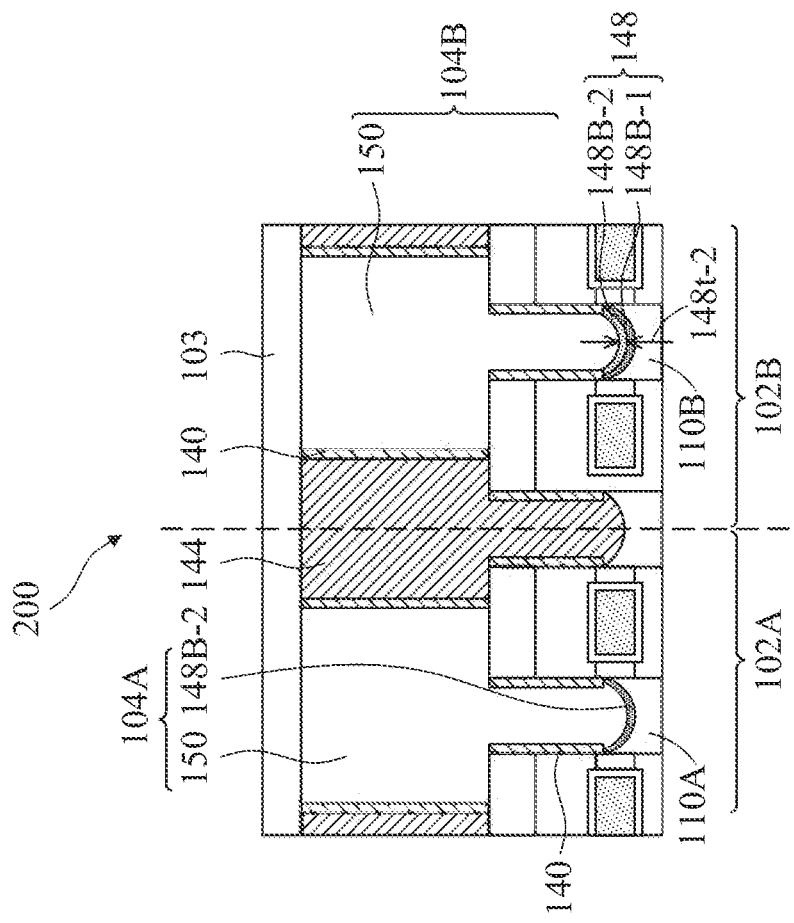
FIGS. 14 and 15 illustrate partial cross-sectional views of a semiconductor device with backside contact structures having dual metal silicide layers at various stages of its fabrication process, in accordance with some embodiments.

In operation 1340 of FIG. 13, a second metal silicide layer is formed on the first metal silicide layer and on the first S/D region. For example, as shown in FIG. 15, second metal silicide layer 148B-2 can be deposited non-selectively on first metal silicide layer 148B-1 in opening 1064B and S/D region 110A in opening 1064A, followed by an anneal at a temperature below about 450° C. In some embodiments, second metal silicide layer 148B-2 can include metals having lower SBH (e.g., about 0.1 eV) and lower contact resistance on S/D region 110A. Examples of the metals used for forming second metal silicide layer 148B-2 can include Ti. The formation of second metal silicide layer 148B-2 can be followed by formation of metal contacts 150 and backside power rails 103.

After the formation of metal silicide layers and metal contacts, backside contact structure 104A can have second metal silicide layer 148B-2 having lower SBH (e.g., about 0.1 eV) and lower contact resistance on S/D region 1110A. Backside contact structure 104B can have first metal silicide layer 148B-1 having lower SBH (e.g., about 0.1 eV) and lower contact resistance on S/D region 1108 and second metal silicide layer 148B-2 on first metal silicide layer 148B-1. First metal silicide layer 148B-1 on S/D region 110E and second metal silicide layer 148B-2 can S/D region 110A can be referred to as "dual metal silicide layers." As a result of dual metal silicide layers, semiconductor device 200 can reduce contact resistances of backside contact structure 104B by about 30% to about 70% without increasing contact resistances of backside contact structure 104A. In some embodiments, backside contact structure 104B can include both epitaxial contact structure 146 and metal silicide layers 148B-1 and 148B-2 to further reduce the contact resistances (not shown).

Various embodiments in the present disclosure provide methods for forming a semiconductor device (e.g., 100 and 200) with backside contact structures 104A and 1048. According to some embodiments, backside contact structures 104A and 104B can include epitaxial contact structure 146. Epitaxial contact structure 146 can have first portion 146-1 in contact with source/drain (S/D) region 110B of semiconductor device 100 and second portion 146-2 on first portion 146-1, A width (e.g., $146w2$) of second portion 146-2 can be larger than a width (e.g., $146w1$) of first portion 146-1. The contact area between epitaxial contact structure 146 and metal contact 150 can be increased and the contact resistance of backside contact structure 104B can be reduced by about 30% to about 70%. In some embodiments, epitaxial contact structure 146 can include an active dopant higher than about $1\times10^{21}$ cm$^{-3}$ to further reduce the contact resistance of backside contact structure 104B.

In some embodiments, backside contact structures 104A and 104B can include different metal silicide layers in contact with the S/D regions of different types of FETs in semiconductor device 200. For example, backside contact structure 104B of one type of FET (e.g., PFET 102B) can have first metal silicide layer 148B-1 on S/D region 110B and second metal silicide layer 148B-2 on first metal silicide layer 148B-1, Backside contact structure 104A of an opposite type of FET (e.g., NFET 102A) can include second metal silicide layer 148B-2 on the S/D regions. First metal silicide layer 148B-1 can include a metal different from second metal silicide layer 148B-2, Which can reduce the SBH between first metal silicide layer 148B-1 and the S/D region 110E of semiconductor device 200 and thus reduce the contact resistance of backside contact structure 104B by about 30% to about 70%. With first metal silicide layer 148B-1 in one type of FET (e.g., PFET 102B) and second metal silicide layer 148B-2 in an opposite type of PET (e.g., NFET 102A), the contact resistance of backside contact structure 104B in the semiconductor device 200 can be reduced without increasing the contact resistance of backside contact structure 104A.

In some embodiments, a method includes forming a semiconductor device on a first side of a substrate. The semiconductor device includes a source/drain (S/D) region. The method further includes etching a portion of the S/D region on a second side of the substrate to form an opening and forming an epitaxial contact structure on the S/D region in the opening. The second side is opposite to the first side. The epitaxial contact structure includes a first portion in contact with the S/D region in the opening and a second portion on the first portion. A width of the second portion is larger than the first portion.

In some embodiments, a method includes forming first and second semiconductor devices on a first side of a substrate. The first semiconductor device includes a first source/drain (S/D) region and the second semiconductor device includes a second S/D region. The method further includes etching a portion of the first S/D region to form a first opening and a portion of the second S/D region to form a second opening on a second side of the substrate, electively forming a first metal silicide layer on the second S/D region in the second opening, and forming a second metal silicide layer on the first metal silicide layer and on the first S/D region. The second side is opposite to the first side. The second metal silicide layer includes a metal different from the first metal silicide layer In some embodiments, a semiconductor device includes a fin structure on a first side of a substrate, a gate structure wrapped around the fin structure, a source/drain (S/D) region in contact with the fin structure, and an epitaxial contact structure in contact with the S/D region on a second side of the substrate. The second side is opposite to the first side. The epitaxial contact structure includes a first portion in contact with the S/D region and a second portion above the first portion. A width of the second portion is larger than the first portion.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a semiconductor device on a first side of a substrate, wherein the semiconductor device comprises a source/drain (S/D) region;
   etching a portion of the S/D region on a second side of the substrate to form an opening, wherein the second side is opposite to the first side; and
   forming an epitaxial contact structure on the S/D region in the opening, wherein the epitaxial contact structure comprises a first portion in contact with the S/D region in the opening and a second portion on the first portion, a width of the second portion being larger than the first portion.

2. The method of claim 1, wherein the forming the epitaxial contact structure comprises forming the second portion having a rounded surface.

3. The method of claim 1, wherein the forming the epitaxial contact structure comprises forming the second portion having one or more facets.

4. The method of claim 1, wherein a ratio of the width of the second portion to the width of the first portion ranges from about 1.1 to about 3.

5. The method of claim 1, wherein the forming the epitaxial contact structure comprises forming the epitaxial contact structure at a temperature ranging from about 350° C. to about 450° C.

6. The method of claim 1, wherein the forming the epitaxial contact structure comprises epitaxially growing the epitaxial contact structure with an active dopant at a concentration higher than about $1\times10^{21}$ cm$^{-3}$.

7. The method of claim 1, further comprising:
forming an additional semiconductor device on the first side of the substrate, wherein the additional semiconductor device comprises an additional S/D region with a different type of dopant from the S/D region;
etching a portion of the additional S/D region on the second side of the substrate to form an additional opening; and
blocking the additional S/D region in the additional opening while forming the epitaxial contact structure on the S/D region.

8. The method of claim 7, wherein blocking the additional S/D region comprises:
forming a mask layer in the additional opening before forming the epitaxial contact structure; and
removing the mask layer in the additional opening after forming the epitaxial contact structure.

9. The method of claim 7, further comprising:
forming a barrier layer in the additional opening;
forming a metal silicide layer on the epitaxial contact structure and the additional S/D region; and
forming a metal contact on the metal silicide layer.

10. The method of claim 7, further comprising:
selectively forming a first metal silicide layer on the epitaxial contact structure;
forming a second metal silicide layer on the first metal silicide layer and the additional S/D region, wherein the second metal silicide layer comprises a metal different from the first metal silicide layer; and
forming a metal contact on the second metal silicide layer.

11. The method of claim 1, further comprising:
forming a first power rail structure on the first side of the substrate and connected to a gate structure of the semiconductor device; and
forming a second power rail structure on the second side of the substrate and connected to the S/D region of the semiconductor device.

12. A method, comprising:
forming first and second semiconductor devices on a first side of a substrate, wherein the first semiconductor device comprises a first source/drain (S/D) region and the second semiconductor device comprises a second S/D region;
etching, on a second side of the substrate, a portion of the first S/D region to form a first opening and a portion of the second S/D region to form a second opening, wherein the second side is opposite to the first side;
selectively forming a first metal silicide layer on the second S/D region in the second opening; and
forming a second metal silicide layer on the first metal silicide layer and on the first S/D region, wherein the second metal silicide layer comprises a metal different from the first metal silicide layer.

13. The method of claim 12, further comprising:
forming a barrier layer in the first and second openings before selectively forming the first metal silicide layer;
forming a metal contact on the second metal silicide layer; and
forming a power rail structure on the second metal silicide layer.

14. The method of claim 13, wherein the forming the barrier layer comprises:
depositing a conformal barrier layer in the first and second openings;
etching a portion of the conformal barrier layer in contact with the first and second S/D regions.

15. The method of claim 12, wherein the selectively forming the first metal silicide layer comprises forming the first metal silicide layer at a temperature below about 450° C.

16. The method of claim 12, wherein the selectively forming the first metal silicide layer comprises forming the first metal silicide layer with a metal precursor including at least one of nickel, cobalt, and ruthenium.

17. A semiconductor device, comprising:
a stack of semiconductor layers on a first side of a substrate;
a gate structure wrapped around the stack of semiconductor layers;
a source/drain (S/D) region in contact with the stack of semiconductor layers;
an inner spacer structure between the stack of semiconductor layers; and
an epitaxial contact structure comprising a semiconductor material and in contact with the S/D region on a second side of the substrate, wherein:
the epitaxial contact structure comprises a first portion in contact with the S/D region and the inner spacer structure and a second portion above the first portion;
a width of the second portion is larger than a width of the first portion; and
the second side is opposite to the first side.

18. The semiconductor structure of claim 17, further comprising a first metal silicide layer in contact with the epitaxial contact structure and a second metal silicide layer on the first metal silicide layer, wherein the second metal silicide layer comprises a metal different from the first metal silicide layer.

19. The semiconductor structure of claim 17, further comprising an interlayer dielectric (ILD) layer on the gate structure, wherein the first portion of the epitaxial contact structure is in contact with the ILD layer and the second portion of the epitaxial contact structure is above the ILD layer.

20. The semiconductor structure of claim 17, wherein a ratio of the width of the second portion to the width of the first portion ranges from about 1.1 to about 3.

* * * * *